(12) United States Patent
Arai

(10) Patent No.: US 7,871,849 B2
(45) Date of Patent: Jan. 18, 2011

(54) METHOD FOR MANUFACTURING PHOTOELECTRIC CONVERSION DEVICE

(75) Inventor: Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/697,650

(22) Filed: Feb. 1, 2010

(65) Prior Publication Data

US 2010/0136735 A1 Jun. 3, 2010

Related U.S. Application Data

(63) Continuation of application No. 12/277,361, filed on Nov. 25, 2008, now Pat. No. 7,674,647.

(30) Foreign Application Priority Data

Nov. 30, 2007 (JP) .............................. 2007-309770

(51) Int. Cl.
*H01L 21/00* (2006.01)
(52) U.S. Cl. .................. 438/57; 438/458; 438/795; 257/E21.032; 257/E21.04
(58) Field of Classification Search .................. 438/57, 438/458, 795; 257/E21.032, E21.04
See application file for complete search history.

(56) References Cited

U.S. PATENT DOCUMENTS

| | | | |
|---|---|---|---|
| 5,665,607 A | 9/1997 | Kawama et al. |
| 5,858,853 A | 1/1999 | Shishiguchi et al. |
| 6,132,817 A | 10/2000 | Tokutake et al. |
| 6,566,277 B1 | 5/2003 | Nakagawa et al. |
| 6,692,981 B2 | 2/2004 | Takato et al. |
| 6,759,284 B2 | 7/2004 | Kang et al. |
| 7,022,586 B2 | 4/2006 | Maleville et al. |
| 7,301,215 B2 | 11/2007 | Kariya |
| 2005/0022864 A1 | 2/2005 | Fujioka et al. |
| 2006/0194417 A1 | 8/2006 | Ishihara et al. |
| 2007/0218630 A1 | 9/2007 | Yamaguchi et al. |
| 2008/0099065 A1 | 5/2008 | Ito et al. |

(Continued)

FOREIGN PATENT DOCUMENTS

EP   1 088 913   4/2001

(Continued)

*Primary Examiner*—Charles D Garber
*Assistant Examiner*—Stanetta D Isaac
(74) *Attorney, Agent, or Firm*—Eric J. Robinson; Robinson Intellectual Property Law Office, P.C.

(57) ABSTRACT

A method for manufacturing a photoelectric conversion device typified by a solar cell, having an excellent photoelectric conversion characteristic with a silicon semiconductor material effectively utilized. The point is that the surface of a single crystal semiconductor layer bonded to a supporting substrate is irradiated with a pulsed laser beam to become rough. The single crystal semiconductor layer is irradiated with the pulsed laser beam in an atmosphere containing an inert gas and oxygen so that the surface thereof is made rough. With the roughness of surface of the single crystal semiconductor layer, light reflection is suppressed so that incident light can be trapped. Accordingly, even when the thickness of the single crystal semiconductor layer is equal to or greater than 0.1 μm and equal to or less than 10 μm, path length of incident light is substantially increased so that the amount of light absorption can be increased.

15 Claims, 21 Drawing Sheets

U.S. PATENT DOCUMENTS

2008/0242050 A1  10/2008  Yamazaki et al.
2008/0246109 A1  10/2008  Ohnuma et al.

FOREIGN PATENT DOCUMENTS

| | | |
|---|---|---|
| JP | 07-226528 | 8/1995 |
| JP | 10-093122 | 4/1998 |
| JP | 10-335683 | 12/1998 |
| JP | 2000-077287 | 3/2000 |
| JP | 2000-150940 | 5/2000 |
| JP | 2001-160540 | 6/2001 |
| JP | 2002-100789 | 4/2002 |
| JP | 2002-348198 | 12/2002 |
| JP | 2003-017723 | 1/2003 |
| JP | 2003-258285 | 9/2003 |
| JP | 2004-014958 | 1/2004 |
| JP | 2005-050905 | 2/2005 |
| JP | 2005-268682 | 9/2005 |

METHOD FOR MANUFACTURING PHOTOELECTRIC CONVERSION DEVICE

BACKGROUND OF THE INVENTION

1. Field of the Invention

The present invention relates to a method for manufacturing a photoelectric conversion device using a single crystal semiconductor or a polycrystalline semiconductor.

2. Description of the Related Art

Total production of solar cells in the world in 2005 was 1,759 MW, which is an increase of 147% as compared to that in the previous fiscal year. Single-crystal-silicon solar cells and polycrystalline silicon solar cells account for a large part of the production of solar cells.

Silicon semiconductors are resources that are widely used not only in the solar cell industry but also in the semiconductor industry for memories, microprocessors, and the like. Therefore, with the year-by-year increase of production of solar cells, the shortage of supply of polycrystalline silicon, which is the material of silicon, and the resulting rise in the price of a silicon wafer have become problems in the industry.

The thickness of a crystalline solar cell using silicon, which is needed to absorb sunlight, is only about 10 μm. Nevertheless, a silicon wafer actually manufactured as a product has a thickness of about 200 to 300 μm. That is, the crystalline solar cell has a thickness ten or more times as large as the thickness needed for photoelectric conversion, and thus the silicon wafer is far from being effectively utilized. Speaking of extremes, most part of the silicon wafer functions only as a structural body for keeping the shape of the solar cell.

While using such a silicon wafer which is thick enough, the crystalline solar cell is provided with a rough-surface structure for light trapping in order to effectively use incident light. Rough-surface structure is formed by using the characteristic of an alkaline solution of NaOH, KOH, or the like in which the etching rate is different depending on the crystal plane direction of silicon. However, it is difficult to form an ideal rough-surface structure by etching with alkaline solution, and thus a method in which a laser processing technology and chemical etching are combined has been disclosed (e.g., see Japanese Published Patent Application No. 2003-258285).

SUMMARY OF THE INVENTION

As described above, the production of solar cells is rate-controlled by the production of polycrystalline silicon which is a material thereof. That is, the following problem becomes obvious: even though the production capability is high enough, the supply cannot nevertheless keep up with the demand because of the shortage of material. Or, the sourcing cost of a silicon wafer is increased, which decreases revenues in the production plant for solar cells.

In view of such circumstances, it is an object of the present invention to provide a method for manufacturing a photoelectric conversion device typified by a solar cell, having an excellent photoelectric conversion characteristic with a silicon semiconductor material effectively utilized.

The present invention relates to a photoelectric conversion device, the point of which is that the surface of a single crystal semiconductor layer bonded to a supporting substrate is irradiated with a pulsed laser beam to become rough.

A method for manufacturing this photoelectric conversion device includes the following process: a single crystal semiconductor substrate and a supporting substrate having an insulating surface are attached to each other with a bonding layer interposed therebetween, the single crystal semiconductor substrate being provided with a first impurity semiconductor layer having one conductivity type, an electrode which is in contact with the first impurity semiconductor layer, and a damaged layer formed by introducing ion beams containing hydrogen cluster ions by at least 70%, which are each larger in mass than a hydrogen molecule, through one surface of the single crystal semiconductor substrate; heat treatment is performed thereon to cleave the damaged layer, and a single crystal semiconductor layer is separated from the single crystal semiconductor substrate to remain over the supporting substrate; the cleavage plane of the single crystal semiconductor layer is irradiated with a pulsed laser beam in an atmosphere containing an inert gas and oxygen to make the surface of the single crystal semiconductor layer rough; and a second impurity semiconductor layer having an opposite conductivity type to the one conductivity type is formed on the cleavage plane side of the single crystal semiconductor layer.

The present invention also includes the case where a third impurity semiconductor layer having the one conductivity type, a non-single-crystal semiconductor layer, and a fourth impurity semiconductor layer having the opposite conductivity type to the one conductivity type are stacked over the second impurity semiconductor layer after the above-described process.

In accordance with the present invention, the single crystal semiconductor layer bonded to the supporting substrate is irradiated with the laser beam in the atmosphere containing oxygen so that the surface of the single crystal semiconductor layer can be made rough. As a result, the surface reflectivity of the single crystal semiconductor layer can be decreased. Using this single crystal semiconductor layer as a photoelectric conversion layer, light trapping effect is produced and the conversion efficiency can be improved.

DETAILED DESCRIPTION OF THE INVENTION

Figure 1:
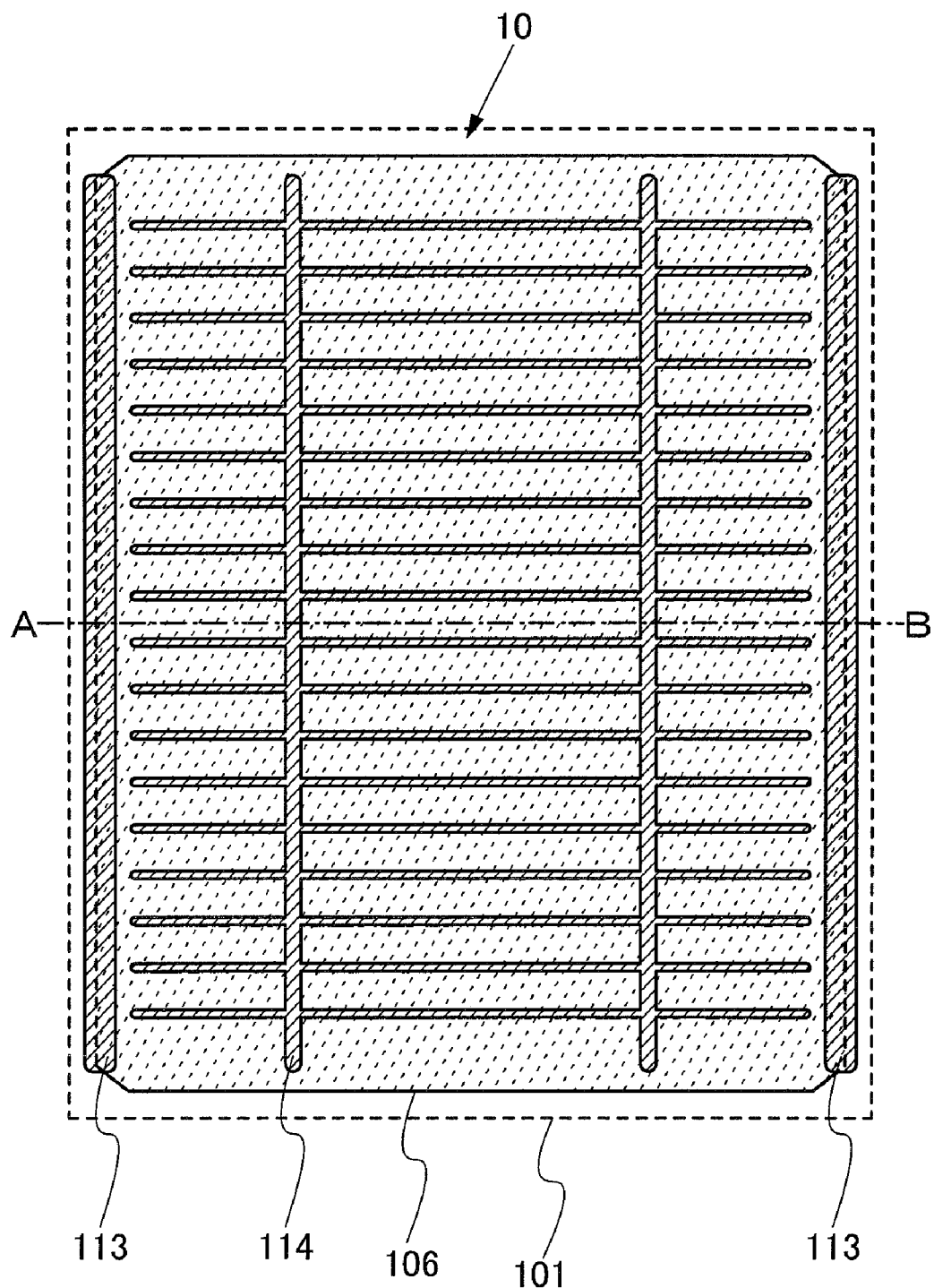
FIG. 1 is a plan view showing a structure of a photoelectric conversion device.

Embodiment modes of the present invention will be described in detail using the drawings. The present invention is not limited to the following description, and it is easily understood by those skilled in the art that modes and details herein disclosed can be modified in various ways without departing from the spirit and scope of the present invention. Therefore, the present invention is not to be construed with limitation to what is described in the embodiment modes. Note that the same portions are denoted by the same reference numerals through the drawings in the structures of the present invention described hereinafter.

Embodiment Mode 1

Described using drawings will be a method for manufacturing a photoelectric conversion device, in which a single crystal semiconductor thin layer is separated from a single crystal semiconductor substrate and transferred to a substrate having an insulating surface or an insulating supporting substrate.

FIG. 1 is a plan view of a photoelectric conversion device 10 of this embodiment mode. This photoelectric conversion device 10 produces a photoelectric effect by light incidence into a single crystal semiconductor layer 106 fixed on a supporting substrate 101. The single crystal semiconductor layer 106 is provided with an impurity semiconductor layer for forming an internal electrical-field. As the single crystal semiconductor layer 106, single crystal silicon is typically used. Alternatively, a polycrystalline semiconductor layer can be used instead of the single crystal semiconductor layer 106; in this case, polycrystalline silicon is used.

In FIG. 1, the surface side of the single crystal semiconductor layer 106 is provided with a second auxiliary electrode 114 which is arranged in a net-like pattern, and the rear surface side thereof is provided with a first electrode (not shown). A first auxiliary electrode 113 is connected to the first electrode which is provided for the rear surface. The photoelectric conversion device 10 of this embodiment mode has a structure in which the single crystal semiconductor layer 106 is attached to the supporting substrate 101 having an insulating surface; therefore, positive and negative electrodes are disposed on the same surface side of the supporting substrate 101.

Figure 2:
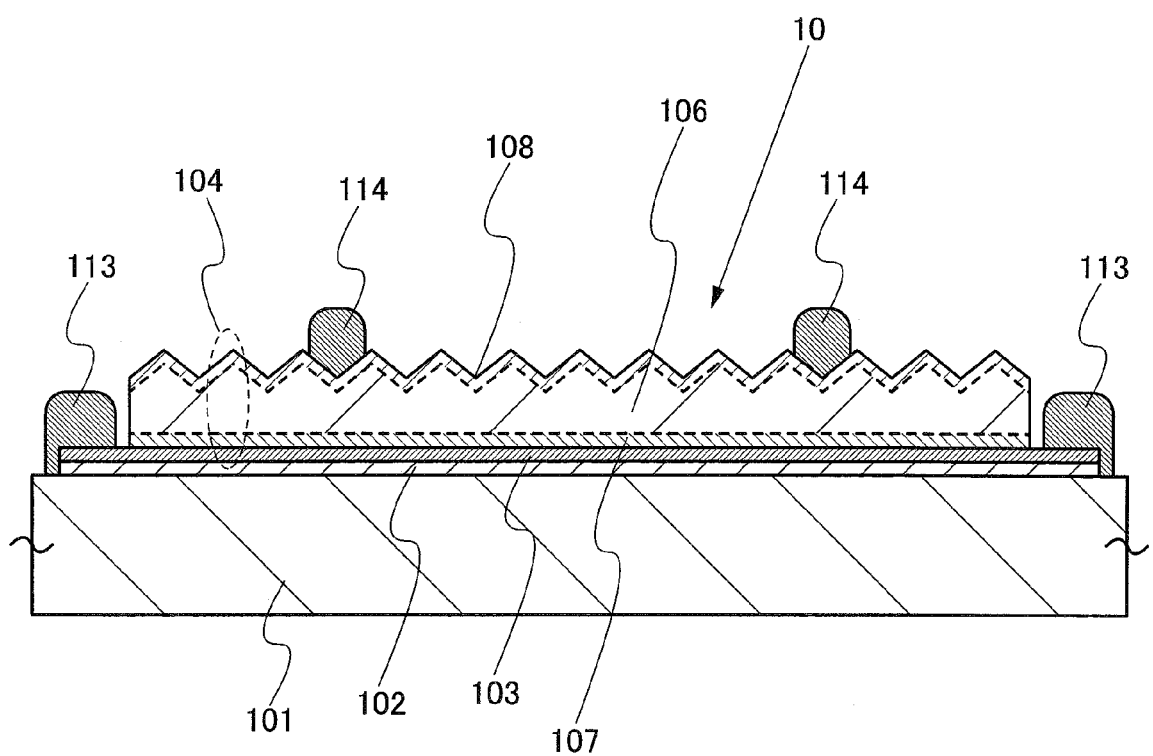
FIG. 2 is a cross-sectional view for describing a manufacturing process of the photoelectric conversion device.

A cross-sectional structure of the photoelectric conversion device 10 along section line A-B of FIG. 1 is shown in FIG. 2. FIG. 2 illustrates the photoelectric conversion device in which the single crystal semiconductor layer 106 is bonded to the supporting substrate 101. The supporting substrate 101 is a substrate having an insulating surface or an insulating substrate; for example, any of a variety of glass substrates that are used in the electronics industry, such as an aluminosilicate glass substrate, an aluminoborosilicate glass substrate, and a barium borosilicate glass substrate, can be used.

An insulating layer 102 is provided between the supporting substrate 101 and the single crystal semiconductor layer 106. A first electrode 103 is provided between the insulating layer 102 and the single crystal semiconductor layer 106. The insulating layer 102 is bonded to the supporting substrate 101 and disposed in close contact with the first electrode 103, whereby the single crystal semiconductor layer 106 is fixed to the supporting substrate 101. The insulating layer 102 is formed of an insulating film having a smooth and hydrophilic surface in order to bond to the supporting substrate 101.

Single crystal silicon is typically used for the single crystal semiconductor layer 106. Alternatively, a polycrystalline semiconductor (typically polycrystalline silicon) layer can be used instead of the single crystal semiconductor layer. A first impurity semiconductor layer 107 having one conductivity type and a second impurity semiconductor layer 108 having a conductivity type opposite to the one conductivity type are each formed by adding a predetermined impurity element to the single crystal semiconductor layer 106. When the first impurity semiconductor layer 107 has p-type conductivity, the second impurity semiconductor layer 108 has n-type conductivity, and vice versa. As a p-type impurity element, an element belonging to Group 13 in the periodic table, such as boron, is used; as an n-type impurity element, an element belonging to Group 15 in the periodic table, such as phosphorus or arsenic, is used. The addition of such an impurity element can be performed by ion implantation or ion doping. In this specification, ion implantation indicates a method by which an ionized gas which has been subjected to mass separation is introduced into a semiconductor, and ion doping indicates a method by which an ionized gas which has not been subjected to mass separation is introduced into a semiconductor.

An internal electric field is formed by forming the first impurity semiconductor layer 107 and the second impurity semiconductor layer 108 in the single crystal semiconductor layer 106, thereby electromotive force can be generated by light irradiation. That is, a unit cell (hereinafter also referred to as a first unit cell 104) is formed with the single crystal semiconductor layer 106, the first impurity semiconductor layer 107, and the second impurity semiconductor layer 108. In the case where the single crystal semiconductor layer 106 is formed of a p-type or n-type single crystal semiconductor, the first impurity semiconductor layer 107 can be omitted.

The single crystal semiconductor layer 106 is formed by slicing a single crystal semiconductor substrate. For example, the single crystal semiconductor layer 106 is formed by a separation method using hydrogen ion implantation in which hydrogen ions are introduced into a single crystal semiconductor substrate at a predetermined depth at high concentration and then heat treatment is performed to separate a single crystal silicon layer at a superficial portion of the single crystal semiconductor substrate. Alternatively, a method may be employed in which a single crystal semiconductor is epitaxially grown on porous silicon and a porous silicon layer is separated by cleavage by water-jetting. As the single crystal semiconductor substrate, a single crystal silicon wafer is typically used. The thickness of the single crystal semiconductor layer 106 is equal to or more than 0.1 μm and equal to or less than 10 μm, preferably equal to or more than 1 μm and equal to or less than 5 μm. When a single crystal silicon semiconductor is used as the single crystal semiconductor layer 106, the single crystal semiconductor layer 106 needs to have thickness of the above range to absorb sunlight because the single crystal silicon semiconductor has an energy gap of 1.12 eV and is of indirect transition type.

The surface of the single crystal semiconductor layer 106 has roughness. The roughness is 300 to 500 nm in the largest difference in peak-to-valley (P-V) height.

The "largest difference in peak-to-valley height" in this specification refers to a difference in height between peak and valley. The "peak" and the "valley" in this specification refer to a peak and a valley obtained by three-dimensional expansion of the "peak" and the "valley" defined by JIS B0601. The peak is represented by the highest part of the peaks in the specified plane. The valley is represented by the lowest part of the valleys in the specified plane. The formation of the roughness of the surface of the single crystal semiconductor layer 106 is controlled by irradiation with a pulsed laser beam in an atmosphere containing oxygen.

The first electrode 103 is in contact with the first auxiliary electrode 113 in the peripheral edge portion of the single crystal semiconductor layer 106, and the second auxiliary electrode 114 is in contact with the second impurity semiconductor layer 108. With this structure, light incidence from the rough surface of the single crystal semiconductor layer 106 causes electromotive force between the first electrode 103 (first auxiliary electrode 113) and the second auxiliary electrode 114. In this time, the rough-surface structure of the single crystal semiconductor layer 106 suppresses light reflection so that incident light into the single crystal semiconductor layer 106 can be trapped. Accordingly, even when the thickness of the single crystal semiconductor layer 106 is equal to or greater than 0.1 μm and equal to or less than 10 μm, preferably equal to or greater than 1 μm and equal to or less than 5 μm, path length of incident light is substantially increased so that the amount of light absorption can be increased. That is, the rough-surface structure of the single crystal semiconductor layer 106 has an effect of improving the conversion efficiency of the photoelectric conversion device 10.

Figure 3:
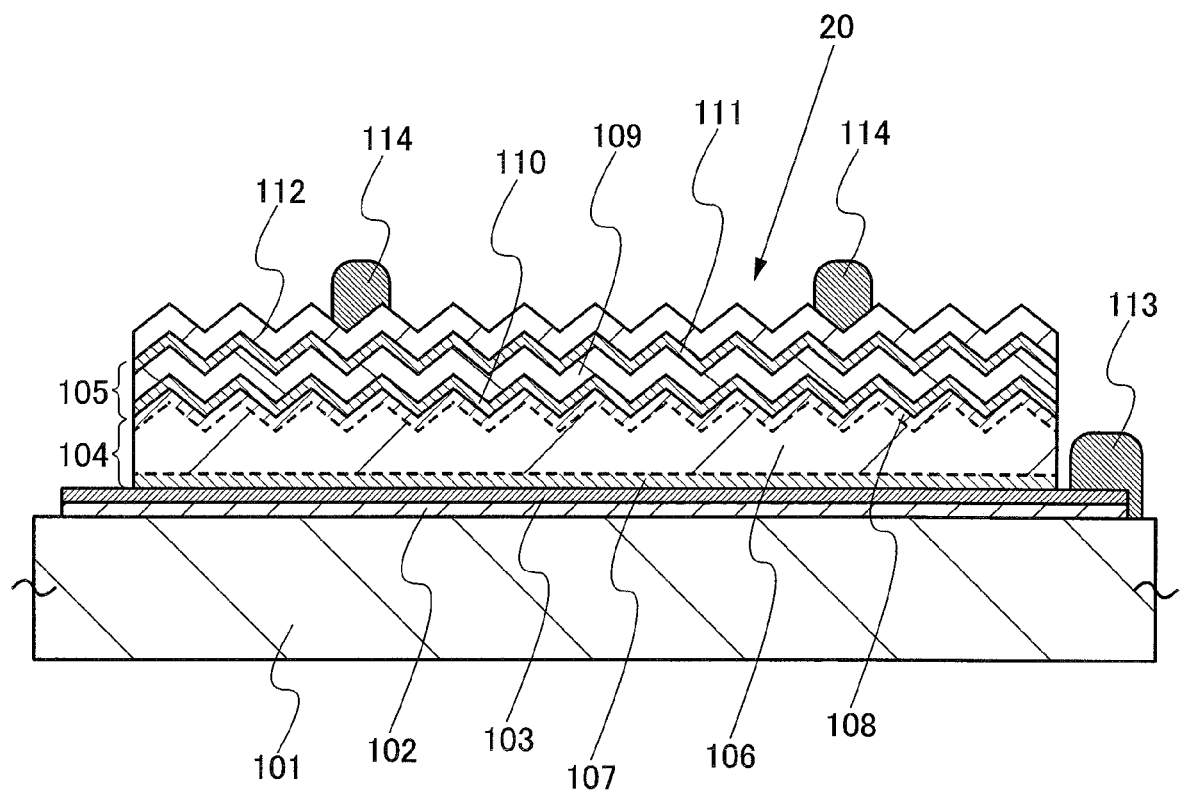
FIG. 3 is a cross-sectional view for describing a manufacturing process of a tandem photoelectric conversion device.

FIG. 3 shows a tandem photoelectric conversion device 20 in which a second unit cell 105 is stacked over the first unit cell 104 shown in FIG. 2. The second unit cell 105 is manufactured using a non-single-crystal semiconductor layer 109. As the non-single-crystal semiconductor layer 109, amorphous silicon which is an amorphous semiconductor is typically applied. Amorphous silicon germanium can be used instead of amorphous silicon. A microcrystal semiconductor (typically microcrystal silicon) layer can be used as the non-single-crystal semiconductor layer 109. A third impurity semiconductor layer 110 having one conductivity type and a fourth impurity semiconductor layer 111 having a conductivity type opposite to the one conductivity type are each formed of an amorphous semiconductor layer or a microcrystal semiconductor layer including a predetermined impurity element. Typically, amorphous silicon or microcrystal silicon containing a predetermined impurity element is used, and amorphous silicon carbide containing a predetermined impurity element can alternatively be used. When the third impurity semiconductor layer 110 has p-type conductivity, the fourth impurity semiconductor layer 111 has n-type conductivity, and vice versa.

The non-single-crystal semiconductor layer 109 is formed by decomposing a reactive gas including a semiconductor source gas with the use of an electromagnetic energy. As the semiconductor source gas, a hydride of silicon typified by silane or disilane, a fluoride of silicon, or a chloride of silicon is used. Such a semiconductor source gas or another semiconductor source gas including hydrogen or an inert gas is used as the reactive gas. The non-single-crystal semiconductor layer 109 is formed by a plasma CVD method using this reactive gas, in which a high-frequency electric power of 10 to 200 MHz is applied as an electromagnetic energy. As the electromagnetic energy, a microwave electric power of 1 to 5 GHz, typically 2.45 GHz may be applied instead of the high-frequency electric power. The third impurity semiconductor layer 110 and the fourth impurity semiconductor layer 111 are formed similarly by a plasma CVD method in which diborane is added as the impurity element to the reactive gas in the case of giving p-type conductivity and phosphine is added as the impurity element to the reactive gas in the case of giving n-type conductivity. As the non-single-crystal semiconductor layer 109, typically, an amorphous silicon layer is used. The thickness of the non-single-crystal semiconductor layer 109 is equal to or greater than 50 nm and equal to or less than 300 nm, preferably equal to or greater than 100 nm and equal to or less than 200 nm. In the case of using an amorphous silicon semiconductor, the energy gap of which is 1.75 eV as the non-single-crystal semiconductor layer 109, the thickness of the above range allows absorption of light with shorter wavelengths than 600 nm so as to convert into electricity.

As the non-single-crystal semiconductor layer 109 of the second unit cell 105, a microcrystal semiconductor layer (typically a microcrystal silicon layer) can also be used. Silane ($SiH_4$) is a typical semiconductor source gas used for forming the microcrystal semiconductor layer, and disilane ($Si_2H_6$) can alternatively be used. Further alternatively, dichlorosilane ($SiH_2Cl_2$), trichlorosilane ($SiHCl_3$), tetrachlorosilane ($SiCl_4$), tetrafluorosilane ($SiF_4$), or the like may be mixed to Silane ($SiH_4$) as appropriate. The microcrystal semiconductor layer is formed by a plasma CVD method using this semiconductor source gas diluted with hydrogen, fluorine, hydrogen and one or more of helium, argon, krypton, and neon, or fluorine and one or more of helium, argon, krypton, and neon. The dilution ratio is preferably 10 to 3000 times. The film deposition is performed using glow discharge plasma generated under reduced pressure of about 0.1 to 133 Pa. The electric power for generating plasma may be high-frequency electric power of HF band or VHF band of 10 to 200 MHz or a microwave electric power of 1 to 5 GHz. Moreover, a carbide gas such as methane ($CH_4$) or ethane ($C_2H_6$) or a germanium gas such as germane ($GeH_4$) or germane tetrafluoride ($GeF_4$) may be mixed into the semiconductor source gas so that the energy band width be 1.5 to 2.4 eV or 0.9 to 1.1 eV. The microcrystal semiconductor layer has lattice distortion which changes the optical characteristics from indirect transition type of single crystal silicon into direct transition type. The lattice distortion of at least 10% causes the optical characteristics to change into direct transition type; however, the local distortion makes the optical characteristics in which direct transition and indirect transition are mixed. The microcrystal semiconductor layer has an energy gap of about 1.45 eV which is larger than that of single crystal silicon; therefore, light with shorter wavelengths than 600 nm can be absorbed and converted into electricity.

The photoelectric conversion device of this embodiment mode has a structure in which light enters from a second electrode 112 side. A second electrode 112 is formed of a transparent conductive material such as indium tin oxide, tin oxide, or zinc oxide. The first electrode 103 is formed of a metal material selected from titanium, molybdenum, tungsten, tantalum, chromium, or nickel. The first electrode 103 includes a layer of a nitride of titanium, molybdenum, tungsten, or tantalum, and the layer of the nitride thereof is in contact with the first impurity semiconductor layer 107. With the provision of the metal nitride between the semiconductor layer and the metal layer, the layers can have closer contact with each other.

The second unit cell 105, which is formed over the rough surface of the single crystal semiconductor layer 106, is affected by the rough-surface structure, whereby the surface of the second electrode 112 is also made rough. Because the surface of the second electrode 112 is rough, reflection of incident light decreases. That is, the rough surface of the second electrode 112 interacts with the rough-surface structure of the lower-positioned single crystal semiconductor layer 106 so that the first unit cell 104 and the second unit cell 105 can produce a light trapping effect. Owing to this effect, the conversion efficiency of the tandem photoelectric conversion device 20 can be improved.

Figure 4:
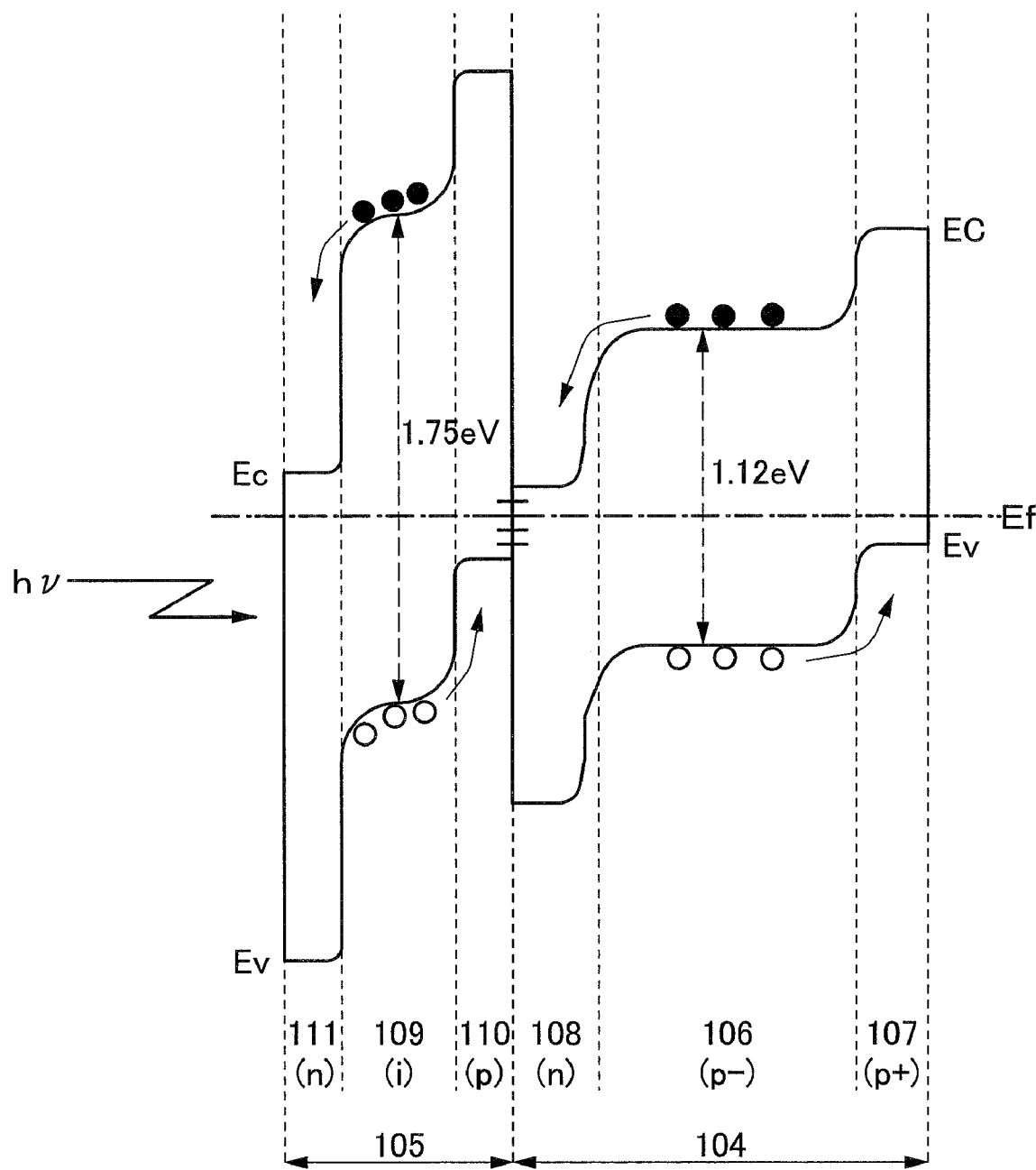
FIG. 4 is an energy band diagram for describing an operation of the tandem photoelectric conversion device.

FIG. 4 is an energy band diagram in the case of using the first unit cell 104 including the single crystal semiconductor layer 106 with an energy gap of 1.12 eV and the second unit cell 105 including the non-single-crystal semiconductor layer 109 with an energy gap of 1.75 eV. The second unit cell 105 including the non-single-crystal semiconductor layer 109 with large energy gap is provided on the side from which light enters and the first unit cell 104 including the single crystal semiconductor layer 106 with small energy gap is provided behind the second unit cell 105. Note that the first impurity semiconductor layer 107 and the third impurity semiconductor layer 110 are p-type semiconductors and the second impurity semiconductor layer 108 and the fourth impurity semiconductor layer 111 are n-type semiconductors in this case.

As shown in the band diagram of FIG. 4, electrons excited by light absorption flow to the n-type semiconductor side and holes flow to the p-type semiconductor side. Consequently, electrons on the first unit cell 104 side and holes on the second unit cell 105 side are trapped. In this case, recombination centers are formed at the bonding interface between the second impurity semiconductor layer 108 and the third impurity semiconductor layer 110 such that recombination current can flow at the bonding interface. The second impurity semiconductor layer 108 is a single crystal semiconductor, and an amorphous semiconductor layer or a microcrystal semiconductor layer is formed by a plasma CVD method or the like as the third impurity semiconductor layer 110 thereover, thereby a bond through which recombination current flows can be formed at the bonding interface.

In the tandem photoelectric conversion device of FIG. 3, the first unit cell 104 including the single crystal semiconductor layer 106 is used as a bottom cell; thus, light with long wavelengths of 800 nm or longer can be absorbed and converted into electricity, which contributes to improvement of photoelectric conversion efficiency. In this case, the single crystal semiconductor layer 106 is thinned to have a thickness of 10 μm or less, so that loss due to recombination of photo-generated carriers can be decreased. With this structure, the roughness of the lower-positioned single crystal semiconductor layer 106 acts on incident light so that light trapping effect can be developed by the first unit cell 104 and the second unit cell 105. Owing to this effect, conversion efficiency of the tandem photoelectric conversion device 20 can be increased.

Embodiment Mode 2

Next, a method for manufacturing the photoelectric conversion device 10 with its cross-sectional structure along section line A-B of FIG. 1 corresponding to the structure shown in FIG. 2 described in Embodiment Mode 1 will be described.

Figure 5A:
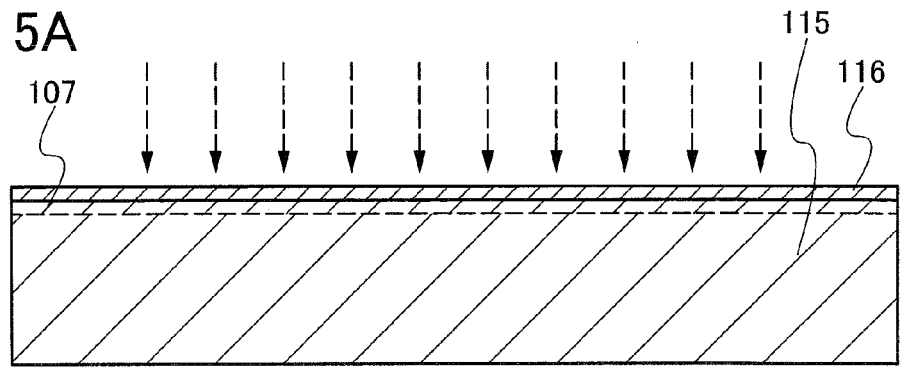
FIGS. 5A to 5D are cross-sectional views for describing the manufacturing process of the photoelectric conversion device.

A semiconductor substrate 115 shown in FIG. 5A is a substrate with a shape approximately a quadrangular shape, cut out from a circular single crystal semiconductor substrate. The semiconductor substrate 115 is typically single crystal silicon and preferably has its surface polished to have a mirror surface. It is preferable that a protection film 116 be formed of silicon oxide or silicon nitride and a chemical vapor deposition method is used for the formation.

The first impurity semiconductor layer 107 having one conductivity type is formed in the semiconductor substrate 115. For example, boron is added as an impurity element which imparts one conductivity type so that the first impurity semiconductor layer 107 is formed to have p-type conductivity. In the photoelectric conversion device of this embodiment mode, the first impurity semiconductor layer 107 is disposed on the side opposite to the side from which light enters so that a back surface field (BSF) is formed. The addition of boron is performed using an ion doping apparatus by which a substrate is irradiated with ions which are accelerated by an electric field without mass separation with diborane ($B_2H_6$) or boron trifluoride ($BF_3$) used as a source gas.

Figure 5B:
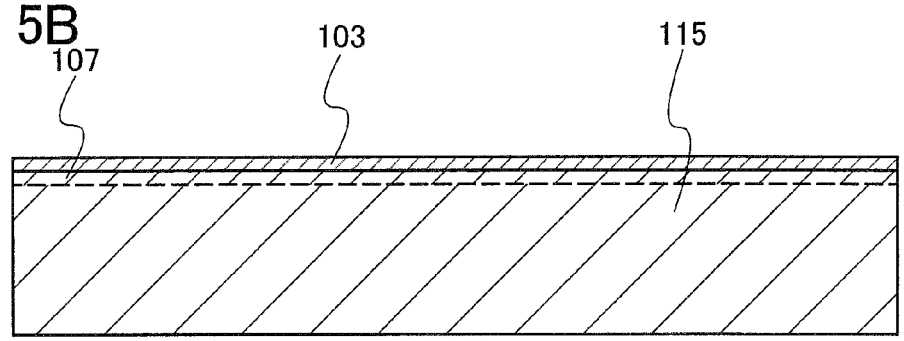

In FIG. 5B, the protection film 116 is removed and the first electrode 103 is formed over the first impurity semiconductor layer 107. It is preferable that the first electrode 103 be formed of heat-resistant metal. As the heat-resistant metal, a metal material such as titanium, molybdenum, tungsten, or chromium is used. A nitride of any of these metal materials may be formed in contact with the first impurity semiconductor layer 107 and stacked over the metal layer so that the first electrode 103 have a two-layer structure. By the formation of the nitride of metal, the first electrode 103 and the first impurity semiconductor layer 107 can have closer contact with each other. The first electrode 103 is formed by a vacuum deposition method or a sputtering method.

Figure 5C:
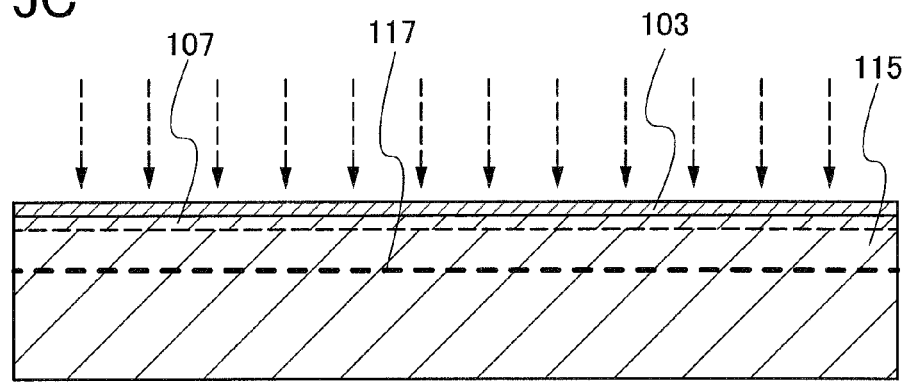

FIG. 5C shows a step of forming a damaged layer 117 by irradiating the surface of the semiconductor substrate 115, provided with the first electrode 103, with ion beams including hydrogen ions. As the hydrogen ions, preferably, cluster ions typified by $H_3^+$ are introduced to form the damaged layer 117 at a certain depth from the surface. The depth of the damaged layer 117 depends on the acceleration energy of the ions. The thickness of the single crystal semiconductor layer separated from the semiconductor substrate 115 is determined depending on the depth of the damaged layer 117; therefore, the electric field intensity for accelerating cluster ions is determined in consideration of the thickness of the single crystal semiconductor layer. It is preferable that the damaged layer 117 be formed at a depth of less than 10 μm, that is, equal to or greater than 50 nm and less than 10,000 nm, preferably equal to or greater than 100 nm and equal to or less than 5,000 nm from the surface of the semiconductor substrate 115. By introducing the cluster ions into the semiconductor substrate 115 through the first electrode 103, the surface of the semiconductor substrate 115 can be prevented from being damaged by the ion irradiation.

The hydrogen cluster ions typified by $H_3^+$ ions can be introduced using an ion doping apparatus in such a manner that hydrogen plasma is generated and ions generated in the plasma are accelerated by an electric field without mass separation. With the use of the ion doping apparatus, ion irradiation can be easily performed even when the area of the semiconductor substrate 115 is large.

Figure 9:
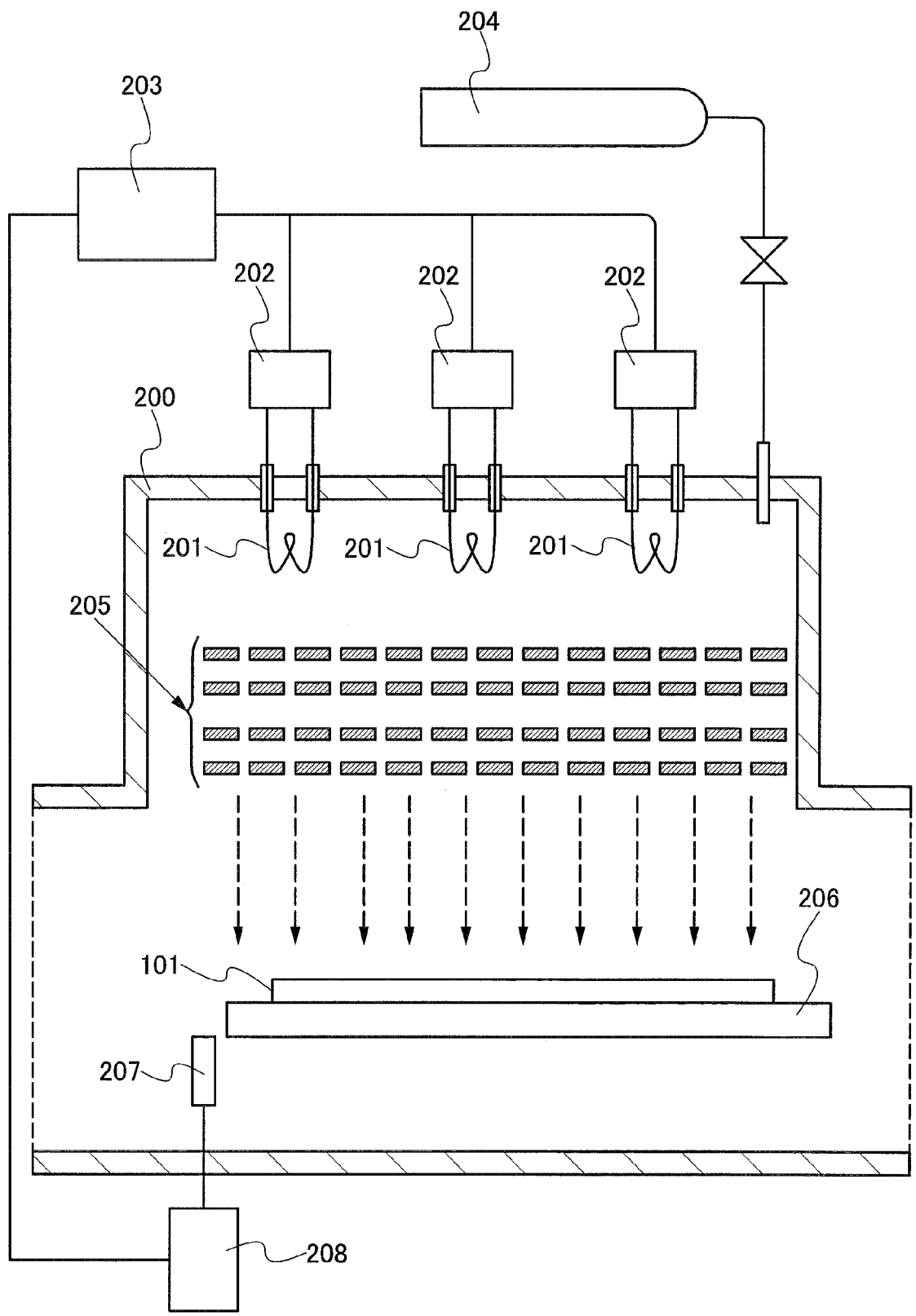
FIG. 9 is a view for describing a structure of an ion doping apparatus.

FIG. 9 illustrates a structure of an ion doping apparatus. Plural kinds of ions having different mass are generated from an ion source 200. A predetermined gas such as hydrogen is supplied from a gas supplying portion 204 to the ion source 200. After the predetermined gas is supplied to the ion source 200, a voltage is applied to filaments 201 in the ion source 200 to generate ark discharge, leading to ionization of hydrogen so that plural kinds of ions having different mass are generated.

The ions generated from the ion source 200 form ion beams by an extraction electrode system 205. The semiconductor substrate 115 disposed on a mounting board 206 is irradiated with the ion beams. The proportions of the ion species in the ion beams are calculated with a mass spectrometer tube 207 disposed near the mounting board 206. The ion density calculated with the mass spectrometer tube 207 is converted into signals by using a mass spectrometer 208 and the results may be fed back to a power source controller 203. Filament power sources 202 can be controlled by the power source controller 203 in accordance with the calculation results on the ion density.

The gas such as hydrogen supplied from the gas supplying portion 204 flows through the chamber of the ion doping apparatus. Hydrogen supplied to the ion source 200 is ionized through the reaction represented by formula (1):

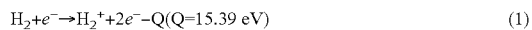

$$H_2 + e^- \rightarrow H_2^+ + 2e^- - Q(Q=15.39 \text{ eV}) \quad (1)$$

The pressure in the chamber of the ion doping apparatus is $1 \times 10^{-2}$ to $1 \times 10^{-1}$ Pa and the ionization degree is not so high; therefore, a larger amount of $H_2$ that is the source gas exists than $H_2^+$ ions. Therefore, $H_2^+$ ions generated from the ion source react with $H_2$ before the extraction by the extraction electrode system 205, and the reaction thereof is represented by formula (2):

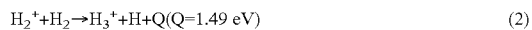

$$H_2^+ + H_2 \rightarrow H_3^+ + H + Q(Q=1.49 \text{ eV}) \quad (2)$$

$H_3^+$ exists as a more stable molecule than $H^+$ and $H_2^+$; therefore, as the proportion of collision with $H_2$ becomes higher, the amount of $H_3^+$ generated is increased. This is apparent from the mass spectrometer result of the ion beams with which the mounting board 206 is irradiated, with the use of the mass spectrometer tube 207; that is, the proportion of $H_3^+$ ions to the total amount of ion species $H^+$, $H_2^+$, and $H_3^+$ is equal to or greater than 70%. Therefore, the substrate is irradiated with ion beams in which a large amount of $H_3^+$ that are cluster ions are generated so that the irradiation efficiency of hydrogen atoms is increased as compared to the case of irradiation with $H^+$ or $H_2^+$ and hydrogen can be introduced into the semiconductor substrate 115 at high concentration even if the dose is small.

Increase of the proportion of $H_3^+$ as the cluster ions enables the damaged layer 117 to contain hydrogen at a concentration which is equal to or greater than $1 \times 10^{20}$ atoms/cm$^3$. In the damaged layer 117 formed in the semiconductor substrate 115, the crystal structure is damaged and microvoids are formed, so that a porous structure is formed. Therefore, the volume of the microvoids formed in the damaged layer 117 is changed by thermal treatment at a relatively low temperature (equal to or less than 600° C.), and cleavage can be performed along the damaged layer 117 to obtain the single crystal semiconductor layer.

Figure 5D:
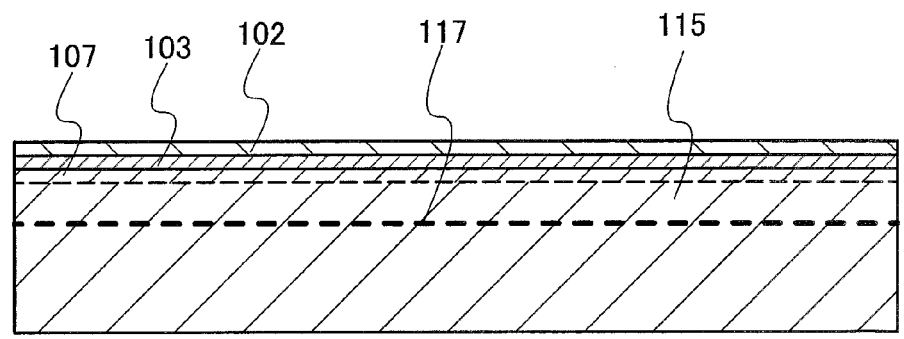

FIG. 5D shows a step of forming the insulating layer 102 over the first electrode 103. The insulating layer 102 is formed of an insulating film of silicon oxide, silicon oxynitride, silicon nitride oxide, silicon nitride film, or the like. There is no limitation on the insulating layer 102 as long as a smooth surface is included and a hydrophilic surface can be provided. As for the smoothness of the insulating layer 102, mean surface roughness (Ra) is preferably equal to or less than 1 nm, more preferably equal to or less than 0.5 nm. The 'mean surface roughness' in this specification refers to a mean surface roughness obtained by three-dimensional expansion of centerline mean roughness which is defined by JIS B0601 so as to be able to be applied to a plane.

As an insulating layer which includes a smooth surface and can provides a hydrophilic surface, silicon oxide containing hydrogen, silicon nitride containing hydrogen, silicon nitride containing oxygen and hydrogen, silicon oxynitride containing hydrogen, silicon nitride oxide containing hydrogen, or the like can be used.

Note that a silicon oxynitride film means a film that contains higher content of oxygen than nitrogen and has concentration ranges of oxygen, nitrogen, silicon, and hydrogen from 55 to 65 at. %, 0.5 to 20 at. %, 25 to 35 at. %, and 0.1 to 10 at. %, respectively. A silicon nitride oxide film means a film that contains higher content of nitrogen than oxygen and has concentration ranges of oxygen, nitrogen, silicon, and hydrogen from 15 to 30 at. %, 20 to 50 at. %, 25 to 35 at. %, and 15 to 25 at. %, respectively.

As a silicon oxide containing hydrogen, for example, a silicon oxide deposited by a chemical vapor deposition method using organosilane is preferable. This is because, with the use of a silicon oxide film as the insulating layer 102 which is deposited using organosilane, a bond between a supporting substrate and a semiconductor layer can be made strong. As the organosilane, an organic compound containing silicon, such as tetraethoxysilane (TEOS) (Si(OC$_2$H$_5$)$_4$), tetramethylsilane (TMS) (Si(CH$_3$)$_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), or tris(dimethylamino)silane (SiH(N(CH$_3$)$_2$)$_3$) can be used.

Silicon nitride containing hydrogen can be deposited by a plasma CVD method using a silane gas and an ammonia gas. Hydrogen may be added to the gases. Silicon nitride containing oxygen and hydrogen can be deposited by a plasma CVD method using a silane gas, an ammonia gas, and a nitrous oxide gas. In any case, any of silicon oxide, silicon oxynitride, or silicon nitride oxide, which contains hydrogen and is deposited by a chemical vapor deposition method such as a plasma CVD method, a low-pressure CVD method, or an atmospheric-pressure CVD method using a silane gas or the like as a source gas can be used. Recommended as the deposition temperature of the insulating layer 102 is a temperature which is equal to or less than 350° C. at which hydrogen is not desorbed from the damaged layer 117 formed in the single crystal semiconductor substrate.

Figure 6A:
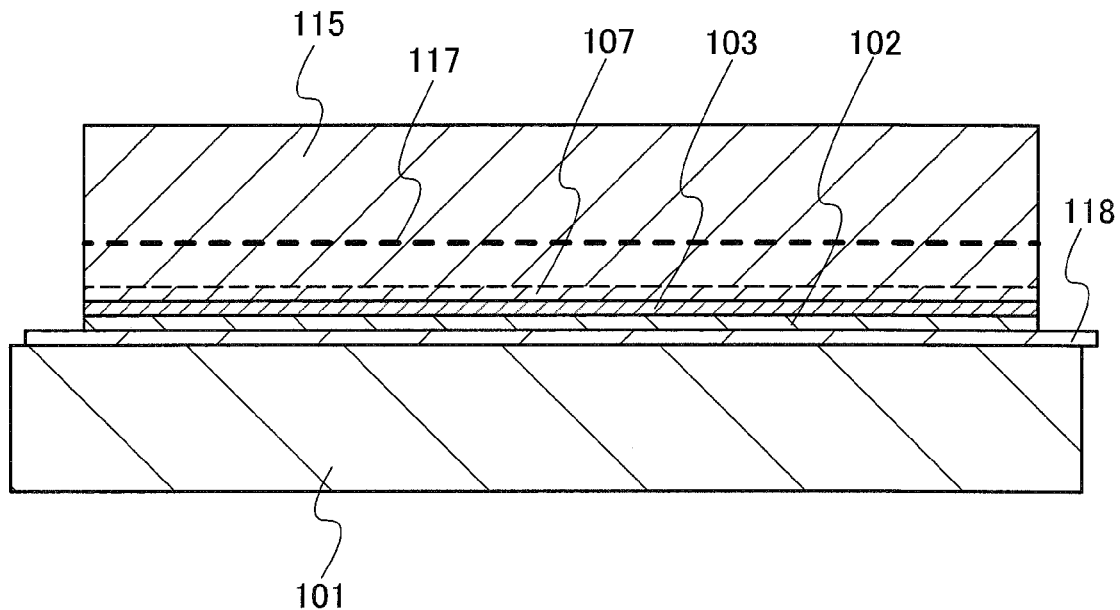
FIGS. 6A and 6B are cross-sectional views for describing the manufacturing process of the photoelectric conversion device.

FIG. 6A shows a step of bonding the supporting substrate 101 to the semiconductor substrate 115. This bonding is formed in such a manner that the insulating layer 102 the surface of which is smooth and hydrophilic is firmly attached to the supporting substrate 101. This bond is formed by a hydrogen bond or Van der Waals forces. Hydroxyl groups or water molecules on surfaces of the semiconductor substrate 115 and the supporting substrate 101 which have become hydropholic serve as an adhesive, whereby the bond is formed. The water molecules are diffused by thermal treatment, and silanol groups (Si—OH) of remaining components are bonded to each other by a hydrogen bond. Further, in this bonding portion, by hydrogen being released, a siloxane bond (a Si—O—Si bond) is formed to generate a covalent bond, so that the bond between the semiconductor substrate 115 and the supporting substrate 101 can be made strong. Note that a silicon nitride film, a silicon nitride oxide film, or the like may be formed as a barrier layer 118 at a bonding surface of the supporting substrate 101. The provision of the barrier layer 118 can prevent contamination due to impurities from the supporting substrate 101.

Figure 6B:
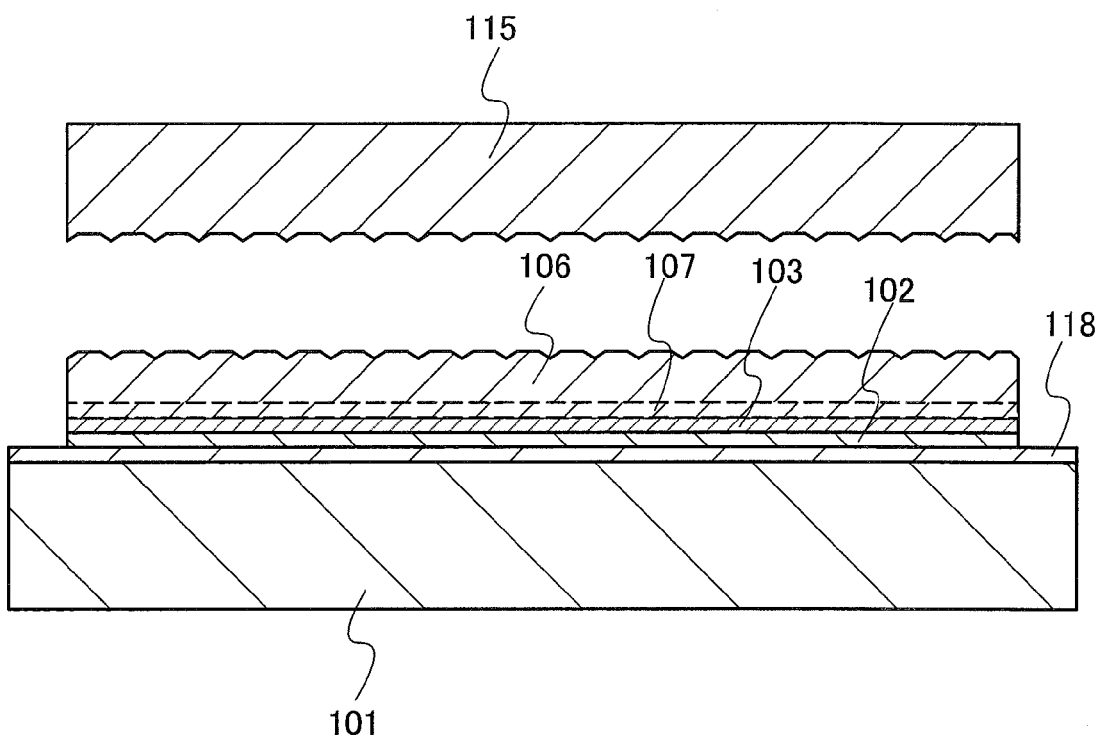

FIG. 6B shows a step of separating part of the semiconductor substrate 115 from the supporting substrate 101 by heat treatment, with the damaged layer 117 served as a cleavage plane. The temperature of the heat treatment is preferably equal to or higher than the deposition temperature of the insulating layer 102 and equal to or less than the upper temperature limit of the supporting substrate 101. For example, the heat treatment is performed at 400 to 600° C., so that the volume of the microvoids formed in the damaged layer 117 is changed, and the semiconductor substrate 115 is cleaved along the region. Since the insulating layer 102 is attached to the supporting substrate 101, the single crystal semiconductor layer 106 and the first electrode 103 remain over the supporting substrate 101. At this time, the thickness of the single crystal semiconductor layer 106 approximately corresponds to the depth at which the damaged layer 117 is formed, and the single crystal semiconductor layer 106 is formed to have a thickness of equal to or greater than 50 nm and less than 10,000 nm, preferably 100 to 5,000 nm. Through the above process, the single crystal semiconductor layer 106 can be provided over the supporting substrate 101 while being fixed by the insulating layer 102.

Figure 7A:
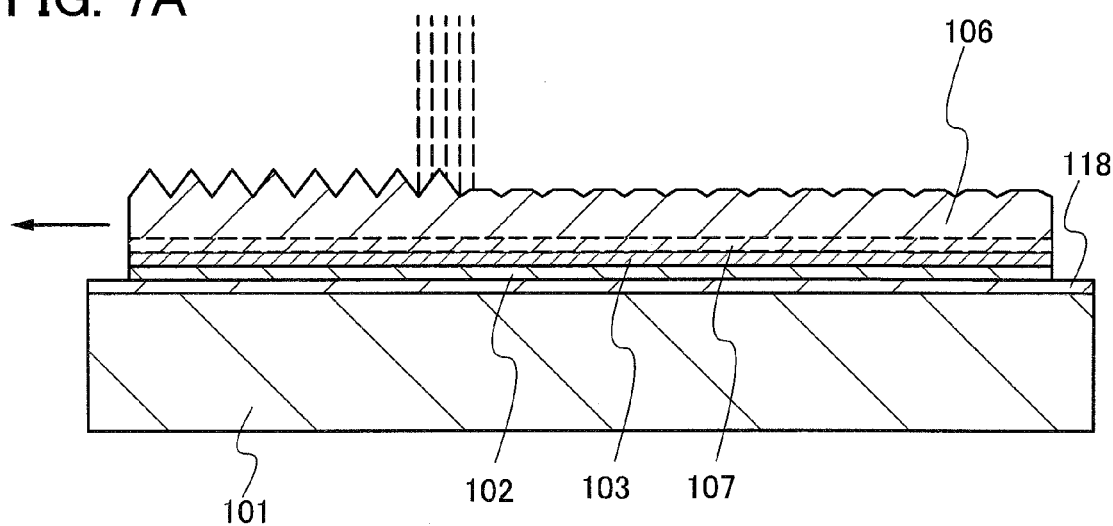
FIGS. 7A to 7C are cross-sectional views for describing the manufacturing process of the photoelectric conversion device.

FIG. 7A shows the step of performing laser treatment on the cleavage plane of the single crystal semiconductor layer 106 in order to repair crystal defects left in the single crystal semiconductor layer 106 and provide roughness for the surface. The cleavage plane of the single crystal semiconductor layer 106 is irradiated with a laser beam, so that at least the cleavage plane side of the single crystal semiconductor layer 106 is melted and is recrystallized in the subsequent cooling step, using a solid-phase lower portion of the single crystal semiconductor layer 106 as a seed crystal. In this procedure, the surface of the single crystal semiconductor layer 106 can be made rough.

This laser treatment is performed by irradiating the cleavage plane of the single crystal semiconductor layer 106 with a pulsed laser beam in an atmosphere containing oxygen. For this laser treatment, it is preferable that the region to be irradiated with the laser beam be heated at 250 to 600° C. in advance. The region to be irradiated is heated in advance, the melting time by the laser beam irradiation can be lengthened, so that the surface can be made rough and crystal defects can be repaired more effectively. The laser beam melts the cleavage plane side of the single crystal semiconductor layer 106, but hardly heats the supporting substrate 101; thus, a supporting substrate the upper temperature limit of which is low, such as a glass substrate, can be used. In addition, since the first electrode 103 is formed of heat-resistant metal, the single crystal semiconductor layer 106 is not adversely affected even if the single crystal semiconductor layer 106 is heated at the above-described temperature. Silicide is formed at an interface between the heat-resistant metal and the first impurity semiconductor layer 107, so that the amount of current flowing therethrough is increased.

The laser treatment for making the surface of the single crystal semiconductor layer 106 rough is performed in an atmosphere in which oxygen is contained in an inert gas typified by nitrogen or argon by 0.1 to 25 vol. %. The laser treatment may alternatively be performed in an atmosphere in which oxygen or an oxide gas is contained in an inert gas typified by nitrogen or argon by 0.1 to 50 vol. %. As the oxide gas, carbon dioxide, nitrogen monoxide, or the like can be used. Further alternatively, the laser treatment may be performed in air, preferably dry air.

For the pulsed laser beam, an excimer laser (XeCl (308 nm), KrF (248 nm), ArF (193 nm)) or a solid-state laser typified by a YAG laser or a YLF laser (second harmonic (532 nm), third harmonic (355 nm), fourth harmonic (266 nm)) is used as a light source (laser). For example, when an excimer laser with a wavelength of 308 nm is used, the single crystal semiconductor layer 106 is irradiated with the laser beam with a repetition rate of 5 to 50 Hz, an energy density of 100 to 500 mJ/cm$^2$, and an overlap ratio of a linear beam of 80 to 98%.

By controlling the wavelength and the number of irradiation times of the pulsed laser beam, roughness with regularity can be provided for the surface of the single crystal semiconductor layer 106. For example, with an excimer laser with a wavelength of 308 nm and an energy density of 350 to 450 mJ/cm$^2$, one region is irradiated with a pulsed laser beam thereof with a pulse width of 10 to 30 ns and a repetition rate of 10 to 50 Hz 20 to 50 times, so that roughness where projections are aligned in a lattice can be formed. The alignment interval between projections can be controlled by the wavelength of the pulsed laser beam. For example, when the excimer laser with a wavelength of 308 nm is used, the pitch of the projections is about 308 nm. When a YLF laser with a wavelength of 527 nm is used, the pitch of the projections is about 527 nm. When a Nd:YAG laser with second harmonic (wavelength: 532 nm) is used, the pitch of the projections is about 532 nm.

An example of a laser treatment apparatus for this laser treatment will be described with reference to FIG. 10. The laser treatment apparatus is provided with a laser 210, an optical system 211 which condenses and extends laser light into a thin linear beam, a gas jetting pipe 212 which controls the atmosphere of a region to be irradiated with a laser, a gas supply portion 213 which supplies a gas for controlling the atmosphere to the gas jetting pipe 212, a flow-rate control portion 214, a gas heating portion 215, a substrate stage 222 which floats and carries the supporting substrate 101, a guide rail 223 which carries the substrate while supporting both ends of the substrate, and a gas supply portion 216 which supplies a gas for floating to the substrate stage 222.

As the laser 210, a laser which emits light with a wavelength in a range from ultraviolet to visible light is selected. The laser 210 preferably is a pulsed ArF, KrF, or XeCl excimer laser, or a solid-state laser such as an Nd-YAG laser or YLF laser, with a repetition rate of 1 MHz or less and a pulse width which is equal to or greater than 10 ns and equal to or less than 500 ns. For example, a XeCl excimer laser with a repetition rate of 10 to 300 Hz, a pulse width of 10 to 30 ns, and a wavelength of 308 nm is used.

The optical system 211 condenses and extends laser light to form a laser beam a cross-section portion of which has a linear shape on a surface to be irradiated. The optical system 211 which forms a linear beam includes a cylindrical lens array 217, a cylindrical lens 218, a mirror 219, and a doublet cylindrical lens 220. The linear laser light of about 100 to 700 mm in a longer direction and about 100 to 500 μm in a shorter direction can be emitted, though it depends on the size of the lens.

The supporting substrate 101 is irradiated with the laser beam condensed into a linear shape through a light introduce window 221 of the gas jetting pipe 212. The gas jetting pipe 212 is provided in vicinity to the supporting substrate 101. A gas containing an inert gas such as nitrogen and oxygen is supplied to the gas jetting pipe 212 from the gas supply portion 213. The gas is jetted from an opening portion of the gas jetting pipe 212, which faces the supporting substrate 101. The opening portion of the gas jetting pipe 212 is provided in accordance with an optical axis of the linear laser beam so that the supporting substrate 101 be irradiated with the laser beam which enters through the light introduce window 221. The oxidizing gas jetted from the opening portion of the gas jetting pipe 212 controls the atmosphere for a region to be irradiated with the laser beam.

The temperature of a surface of the supporting substrate 101, which is to be irradiated with the laser beam, can be controlled so as to be 100 to 600° C. by controlling the temperature of the gas heating portion 215 so as to be 250 to 700° C. with the gas containing an inert gas such as nitrogen and oxygen which is supplied to the gas jetting pipe 212. Accordingly, melting time by the laser beam irradiation can be controlled as described above.

Air or nitrogen is supplied to the substrate stage 222 from the gas supply portion 216 through the flow-rate control portion 214. A gas supplied from the gas supply portion 216 is jetted so that a bottom surface of the supporting substrate 101 be sprayed with the gas from a top surface of a substrate stage 222; in this manner, the supporting substrate 101 is floated. The supporting substrate 101 is carried with its both ends mounted on a slider 224 which moves on the guide rail 223. Since the supporting substrate 101 is sprayed with the gas from the substrate stage 222 side, the supporting substrate 101 can be carried without being curved while it is floated. In the laser treatment apparatus of this embodiment mode, a nitrogen gas is jetted from the gas jetting pipe 212 to the top surface of the supporting substrate 101, and therefore, the supporting substrate 101 can be prevented from being bent by spraying of a gas also from a back surface of the supporting substrate 101. The substrate stage 222 with such a structure is effective for processing a supporting substrate of more than 500 mm on a side and 1 mm or less in thickness. For example, a supporting substrate with a size from 600 mm×720 mm to 730 mm×920 mm with a thickness of 0.7 mm or less can be processed.

The substrate stage 222 can be divided into a region including a laser irradiation portion and the vicinity thereof, and the other region. The laser irradiation portion and the vicinity thereof of the substrate stage 222 can be sprayed with a nitrogen gas heated by the gas heating portion 215, so that the supporting substrate 101 can be heated.

Figure 10:
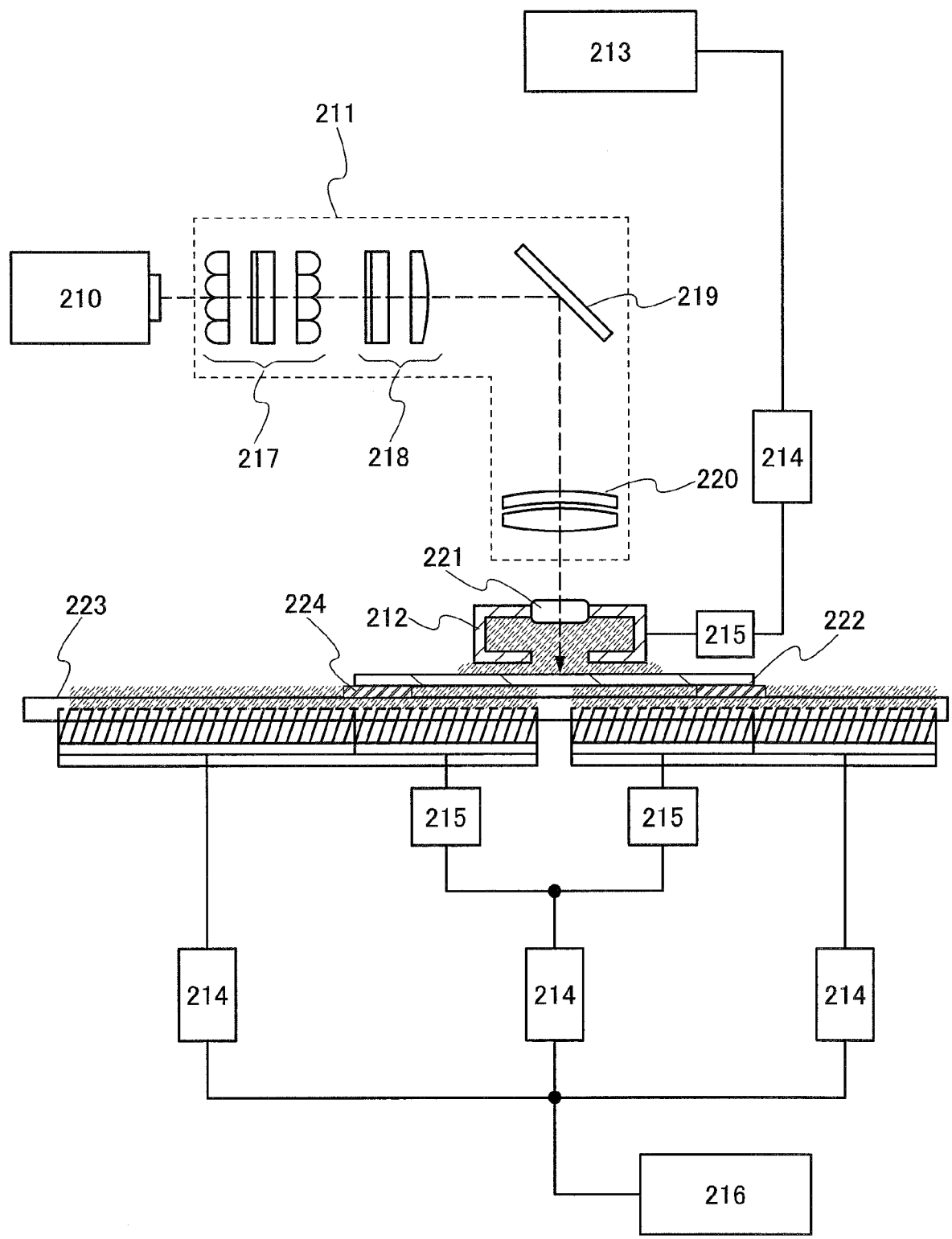
FIG. 10 is a view for describing a structure of a laser processing apparatus.

The laser treatment apparatus shown in FIG. 10 is only an example; any other structure can be employed as long as the atmosphere at the time of laser irradiation can be controlled so as to be the atmosphere containing an inert gas such as nitrogen and oxygen. For example, the supporting substrate is held in an airtight chamber with a window through which a laser beam can be introduced, and a gas containing an inert gas such as nitrogen and oxygen is introduced to control the atmosphere.

Figure 7B:
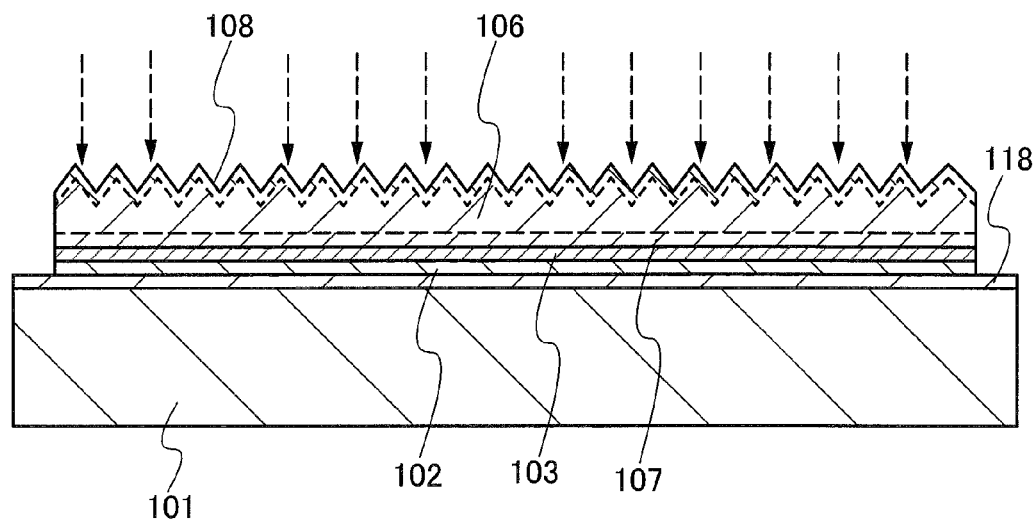

In FIG. 7B, an impurity element which imparts a conductivity type opposite to that of the first impurity semiconductor layer 107 is added into the single crystal semiconductor layer 106 to form the second impurity semiconductor layer 108. For example, phosphorus or arsenic is added so that the second impurity semiconductor layer 108 is formed to have n-type conductivity. In this case, since the crystal defects in the surface are repaired by the laser treatment of the preceding step, the impurity concentration of the second impurity semiconductor layer 108 can be controlled precisely. That is, laser beam irradiation is performed to process the surface of the single crystal semiconductor layer, and then an impurity region is formed, so that the impurity concentration of the impurity region can be high and a shallow junction can be formed. Accordingly, a photoelectric conversion device which has high collection efficiency of photogenerated carriers can be formed.

Figure 7C:
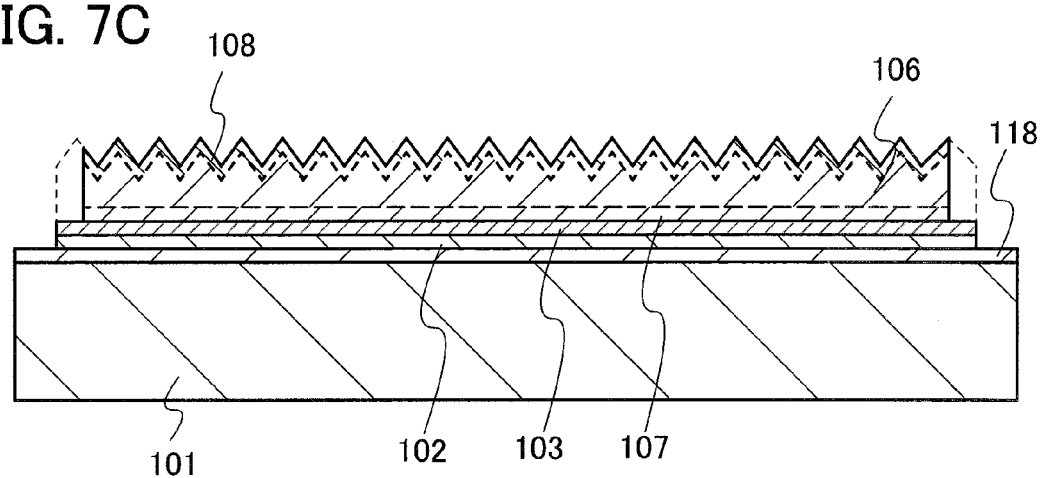

FIG. 7C shows a step of etching off an end portion of the single crystal semiconductor layer 106 to expose part of the first electrode 103. For the etching, a mask is formed over the single crystal semiconductor layer 106 and dry etching is performed using a gas of nitrogen trifluoride ($NF_3$), sulfur hexafluoride ($SF_6$), or the like.

Figure 8A:
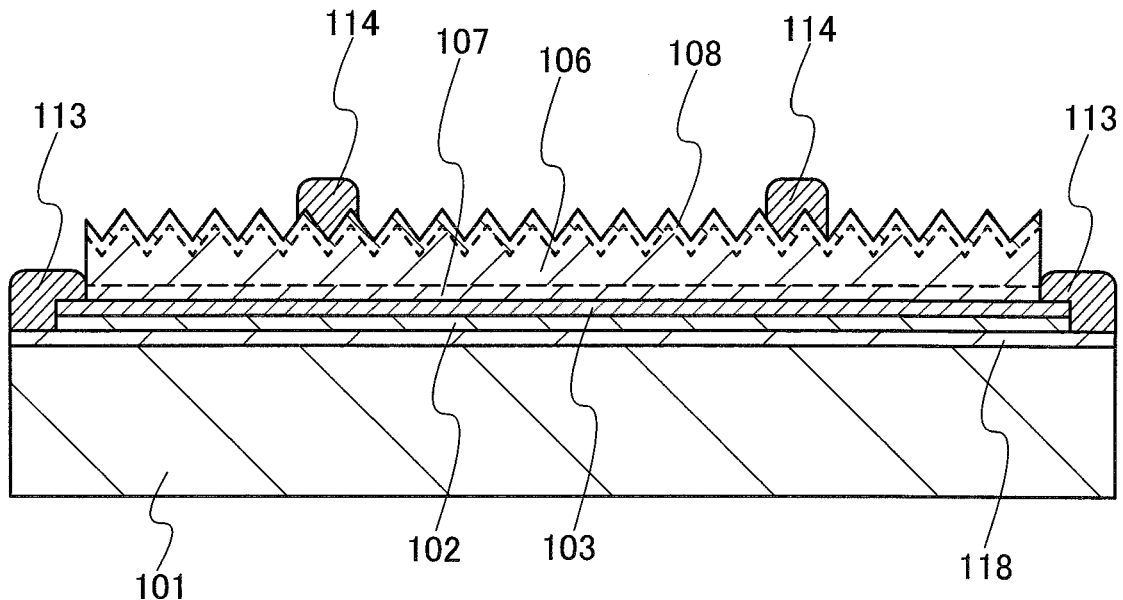
FIGS. 8A and 8B are cross-sectional views for describing the manufacturing process of the photoelectric conversion device.

FIG. 8A shows a step of forming the first auxiliary electrode 113 which is in contact with the first electrode 103 and the second auxiliary electrode 114 over the second impurity semiconductor layer 108. The first auxiliary electrode 113 is formed to be in contact with the part of the first electrode 103 exposed by the etching shown in FIG. 7C. As shown in the plan view of FIG. 1, the second auxiliary electrode 114 is a comb-shaped or lattice-shaped electrode. The first auxiliary electrode 113 and the second auxiliary electrode 114 may be each formed of aluminum, silver, lead-tin (solder), or the like; for example, a screen printing method using a silver paste is employed.

Figure 8B:
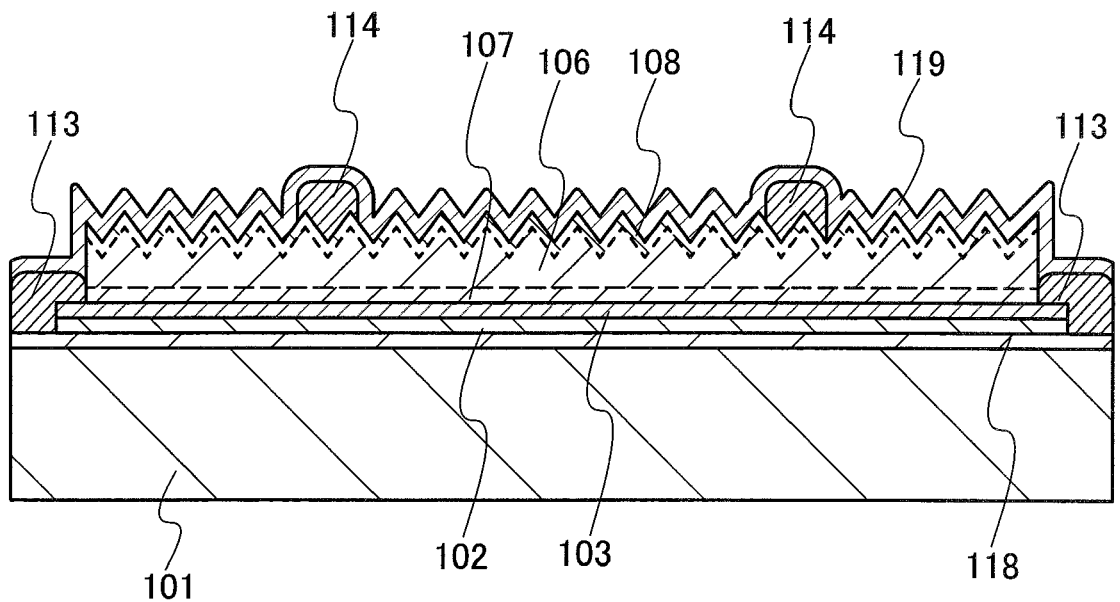

After that, as shown in FIG. 8B, an antireflection film 119 which also serves as a passivation film is formed. It is preferable that the antireflection film 119 be formed of a silicon nitride film; a stacked-layer film of silicon nitride and silicon nitride oxide may be used.

Through the above-described process, the photoelectric conversion device 10 shown in FIG. 1 can be manufactured. According to the process in this embodiment mode, a technique of bonding different materials and a technique of laser treatment are used so that a photoelectric conversion device which includes a single crystal semiconductor layer with a thickness of 10 μm or less can be manufactured at a process temperature of 700° C. or less (preferably equal to or less than 500° C.). That is, a photoelectric conversion device including a single crystal semiconductor layer can be manufactured over a large-area glass substrate the upper temperature limit of which is equal to or lower than 700° C. The single crystal semiconductor layer is obtained by separating a superficial portion of a single crystal semiconductor substrate. The single crystal semiconductor substrate can be used repeatedly, which leads to effective use of resources. Moreover, by manufacturing a second unit cell though a similar process to the above, the tandem photoelectric conversion device shown in FIG. 3 can be manufactured.

Embodiment Mode 3

Figure 11A:
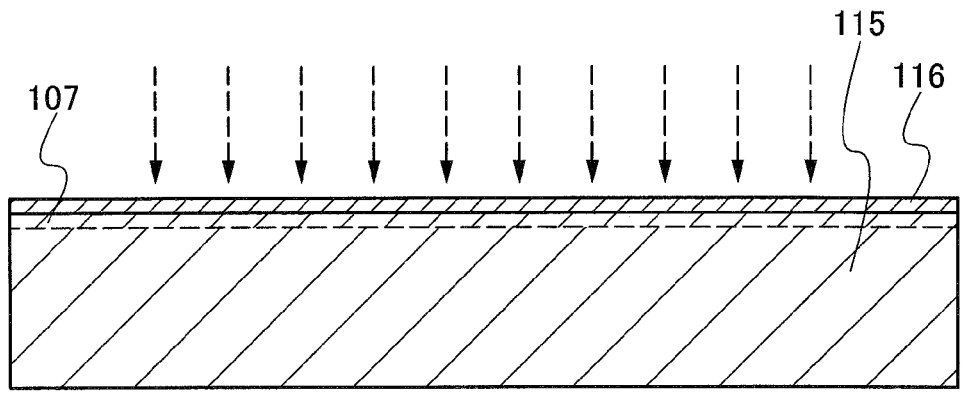
FIGS. 11A to 11C are cross-sectional views for describing a manufacturing process of the photoelectric conversion device.
Figure 11B:
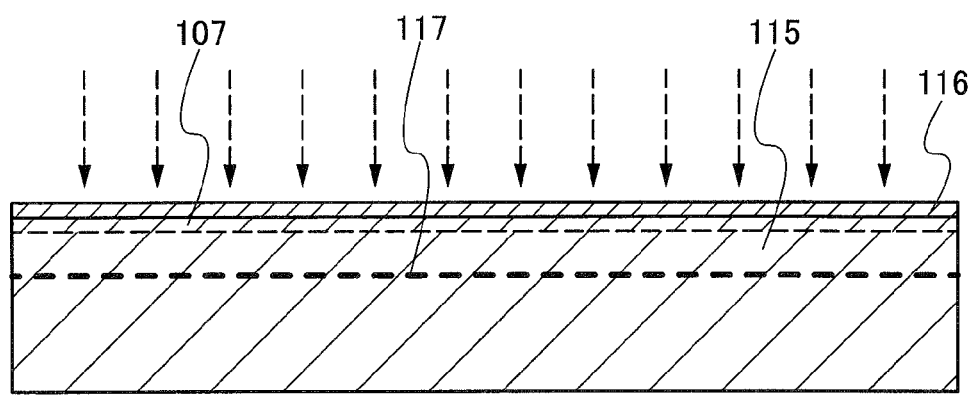
Figure 11C:
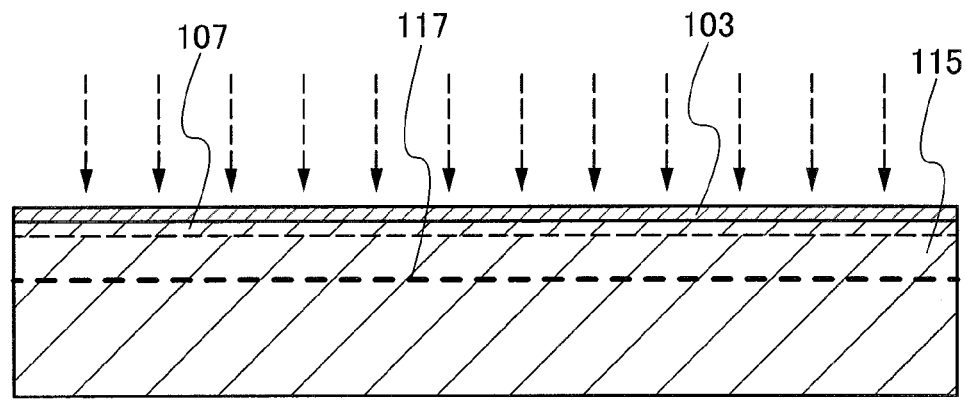

In this embodiment mode, manufacturing steps which are different from those in Embodiment Mode 2 will be described with reference to FIGS. 11A to 11C. The protection film 116 is formed and the first impurity semiconductor layer 107 is formed in the semiconductor substrate 115 (FIG. 11A), and then the damaged layer 117 is formed with the protection film 116 left (FIG. 11B). After that, the protection film 116 is removed and the first electrode 103 is formed (FIG. 11C). The process of this embodiment mode make it possible to effectively use the protection film 116. That is, the protection film 116 is removed after the formation of the damaged layer 117, so that a bonding surface of the semiconductor substrate 115 can be flat. It is preferable that the protection film 116 be provided to have a thickness of 50 to 200 nm. In addition, the damaged layer 117 is formed by introducing cluster ions of hydrogen through the first impurity semiconductor layer 107, so that hydrogenation of the first impurity semiconductor layer 107 can be performed at the same time.

Embodiment Mode 4

Figure 12A:
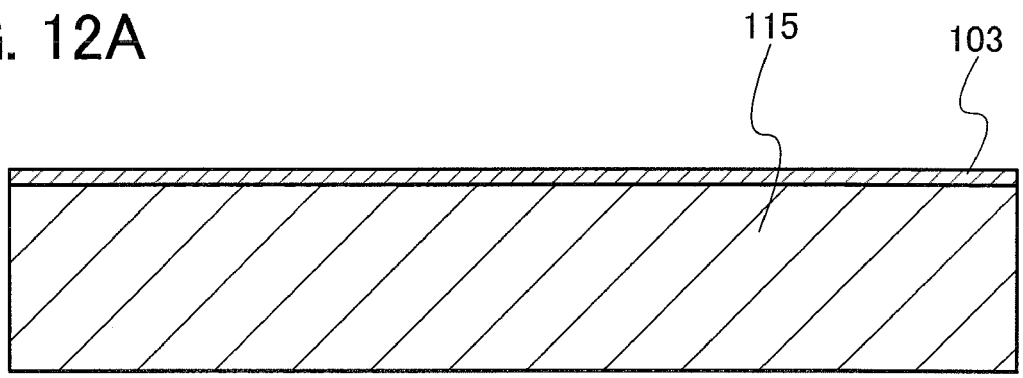
FIGS. 12A to 12C are cross-sectional views for describing a manufacturing process of the photoelectric conversion device.
Figure 12B:
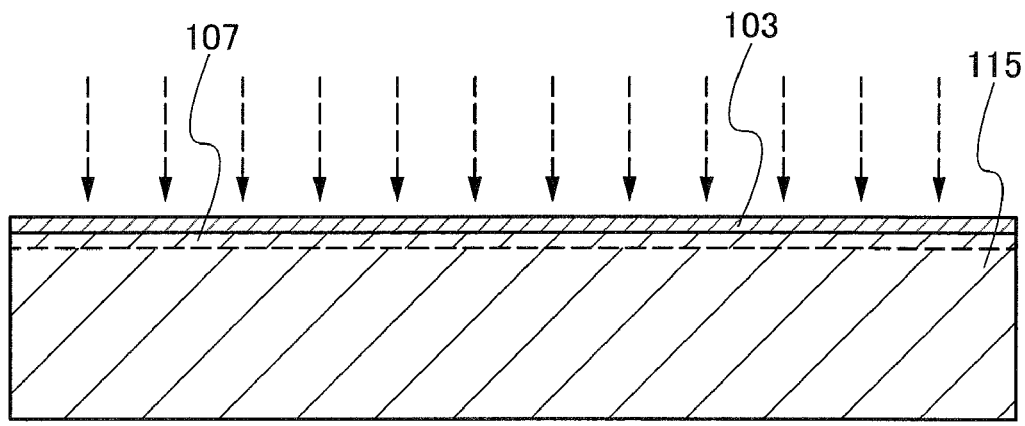
Figure 12C:
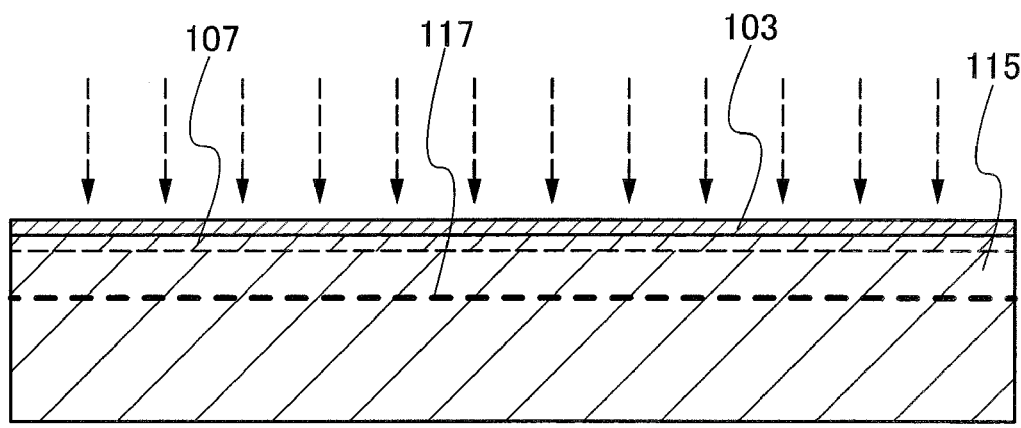

In this embodiment mode, manufacturing steps which are different from those in Embodiment Mode 2 will be described with reference to FIGS. 12A to 12C. The first electrode 103 is formed over the semiconductor substrate 115 (FIG. 12A), and an impurity element which imparts one conductivity type is added through the first electrode 103 to form the first impurity semiconductor layer 107 (FIG. 12B). Then, cluster ions of hydrogen are introduced through the first electrode 103 to form the damaged layer 117 (FIG. 12C). In this process, the first electrode 103, which is formed before ion doping, can be used as a layer against damage due to the ion doping. Therefore, a step of forming a protection film for ion doping can be omitted.

Embodiment Mode 5

Figure 13A:
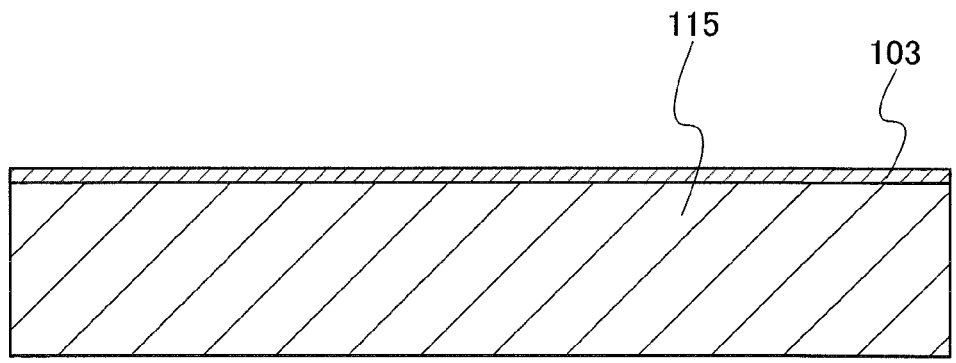
FIGS. 13A to 13C are cross-sectional views for describing a manufacturing process of the photoelectric conversion device.
Figure 13B:
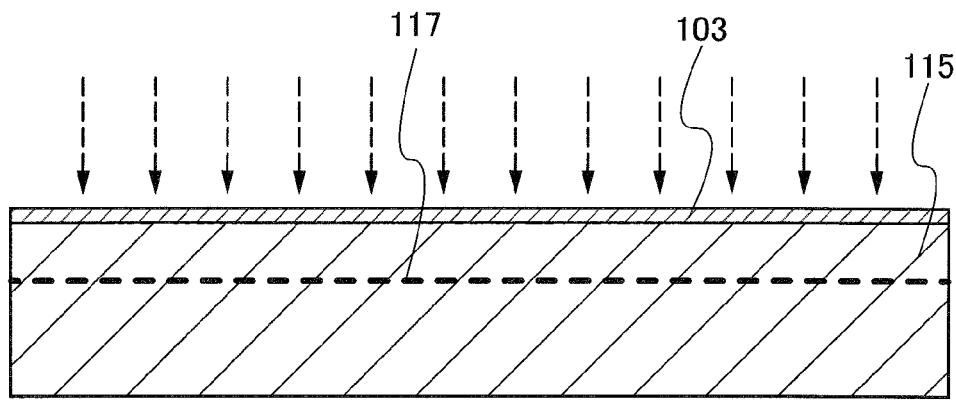
Figure 13C:
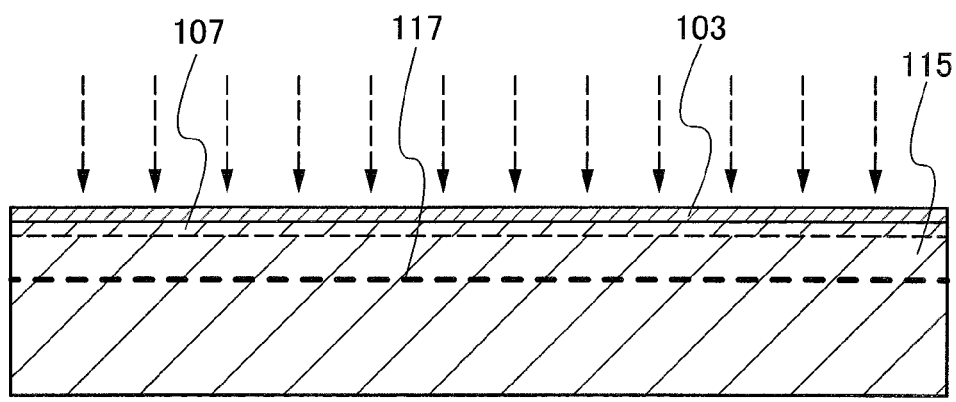

In this embodiment mode, manufacturing steps which are different from those in Embodiment Mode 2 will be described with reference to FIGS. 13A to 13C. The first electrode 103 is formed over the semiconductor substrate 115 (FIG. 13A), and cluster ions of hydrogen are introduced through the first electrode 103 to form the damaged layer 117 (FIG. 13B). Then, an impurity element which imparts one conductivity type is added through the first electrode 103 to form the first impurity semiconductor layer 107 (FIG. 13C). In this process, the first electrode 103, which is formed first, can be used as a layer against damage due to ion doping. Therefore, a step of forming a protection film for ion doping can be omitted in this embodiment mode.

Embodiment Mode 6

Figure 14A:
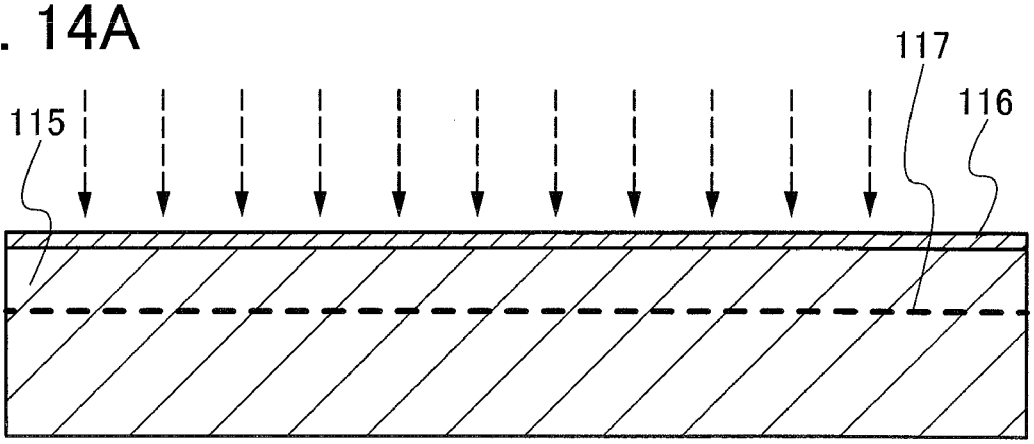
FIGS. 14A to 14C are cross-sectional views for describing a manufacturing process of the photoelectric conversion device.
Figure 14B:
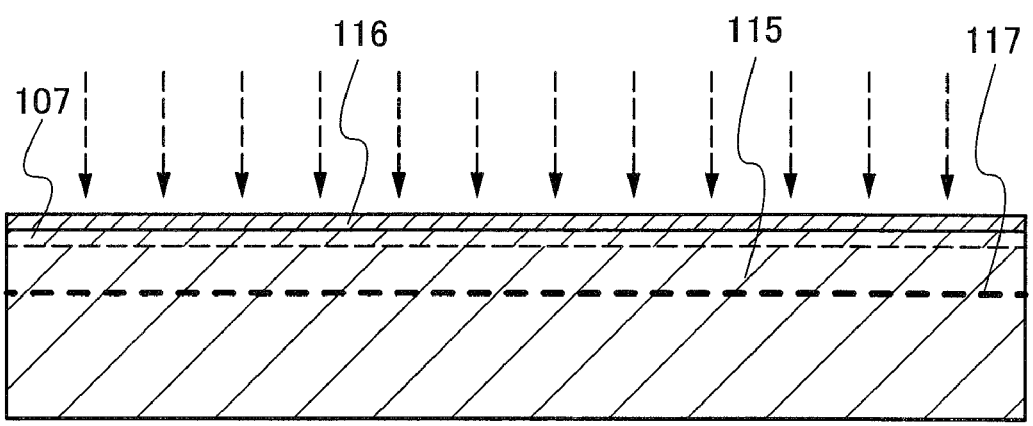
Figure 14C:
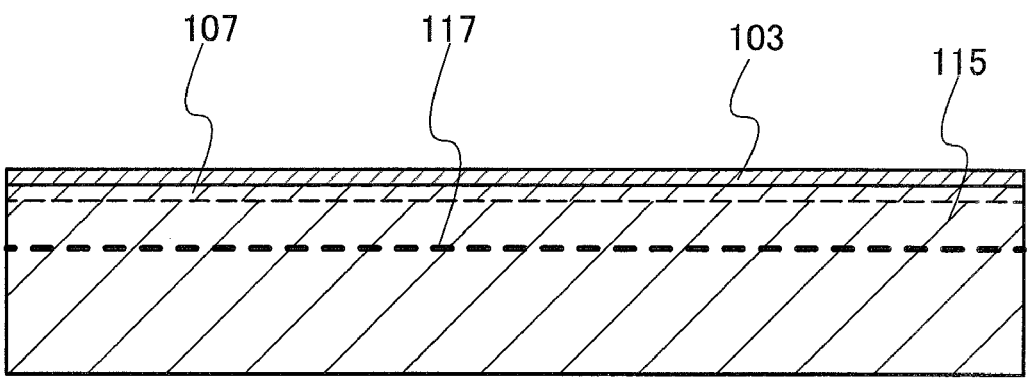

In this embodiment mode, manufacturing steps which are different from those in Embodiment Mode 2 will be described with reference to FIGS. 14A to 14C. The protection film 116 is formed, and cluster ions of hydrogen are introduced into the semiconductor substrate 115 to form the damaged layer 117 (FIG. 14A), and the first impurity semiconductor layer 107 is formed with the protection film 116 left (FIG. 14B). Then, the protection film 116 is removed and the first electrode 103 is formed (FIG. 14C). In this process, the protection film 116 is effectively used as a layer against damage due to ion doping and as a film for controlling the doping depth for forming the first impurity semiconductor layer 107. In addition, since the first impurity semiconductor layer 107 is farmed after the damaged layer 117 is formed, the impurity concentration of the first impurity semiconductor layer 107 can be increased and a shallow junction can be formed. Accordingly, back surface field (BSF) effect is produced and collection efficiency of photogenerated carriers can be increased.

Embodiment Mode 7

Figure 15A:
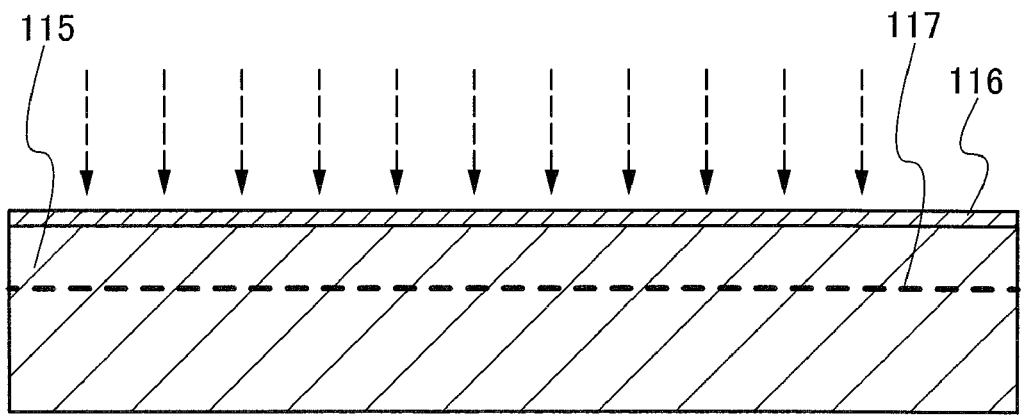
FIGS. 15A to 15C are cross-sectional views for describing a manufacturing process of the photoelectric conversion device.
Figure 15B:
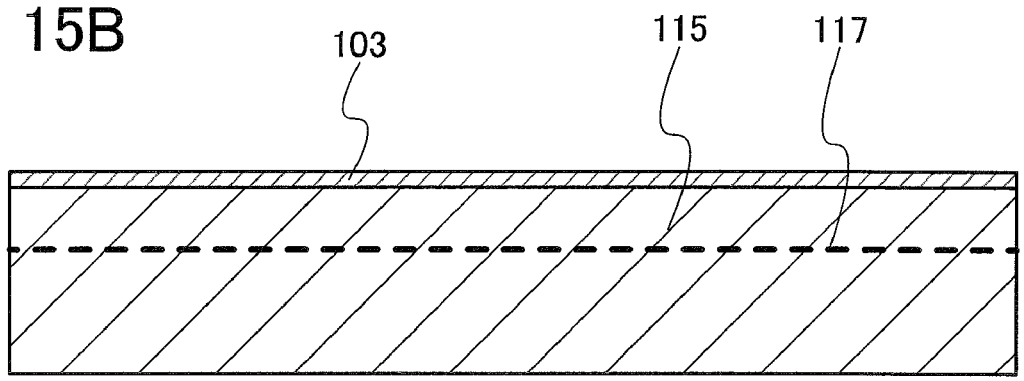
Figure 15C:
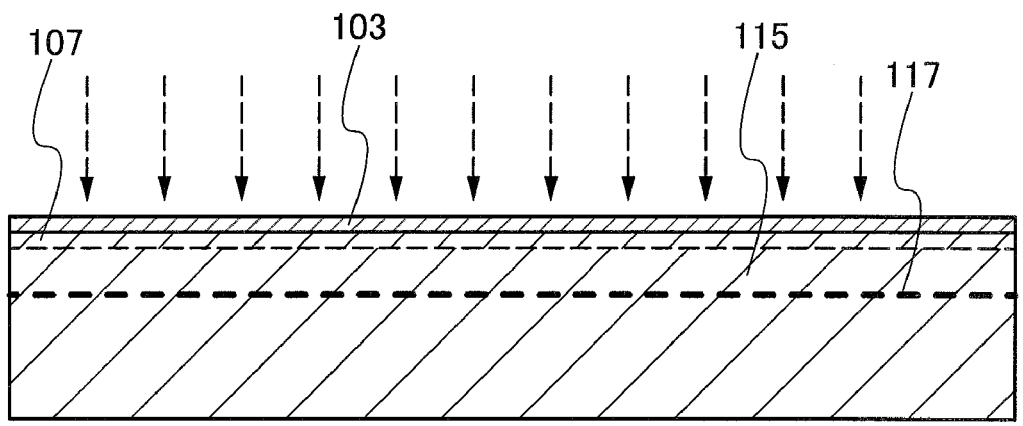

In this embodiment mode, manufacturing steps which are different from those in Embodiment Mode 2 will be described with reference to FIGS. 15A to 15C. The protection film 116 is formed, and cluster ions of hydrogen are introduced to form the damaged layer 117 (FIG. 15A), and the protection film 116 is removed and the first electrode 103 is formed (FIG. 15B). Then, an impurity element which imparts one conductivity type is added through the first electrode 103 to form the first impurity semiconductor layer 107 (FIG. 15C). Since the first impurity semiconductor layer 107 is formed through the first electrode 103, the thickness of the first impurity semiconductor layer 107 can be easily controlled.

Embodiment Mode 8

Figure 16A:
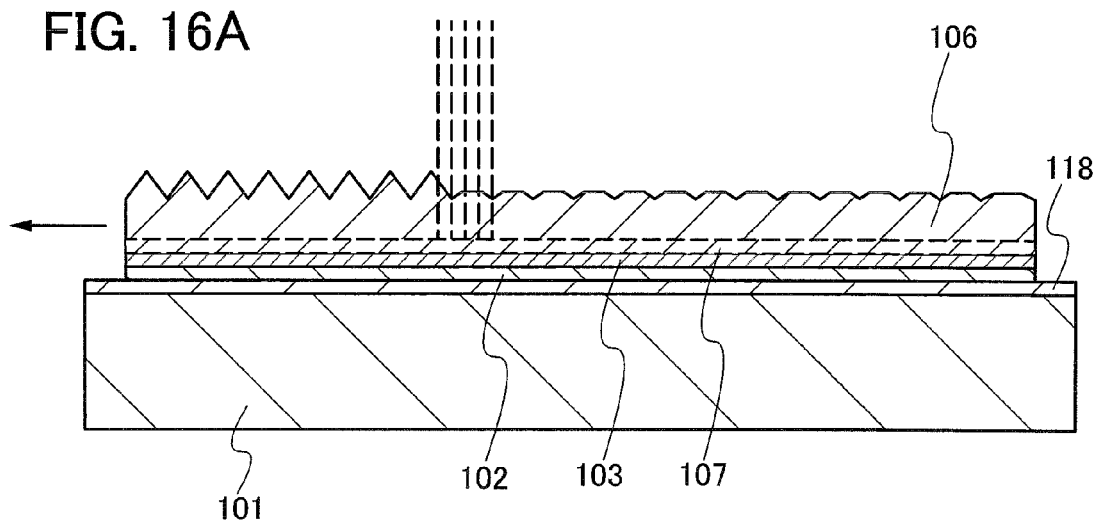
FIGS. 16A to 16C are cross-sectional views for describing a manufacturing process of the photoelectric conversion device.
Figure 16B:
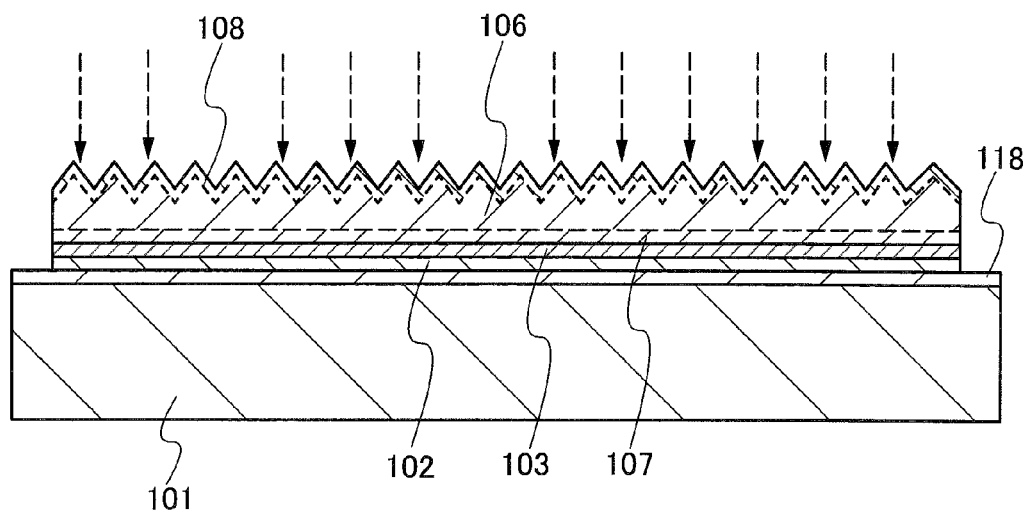
Figure 16C:
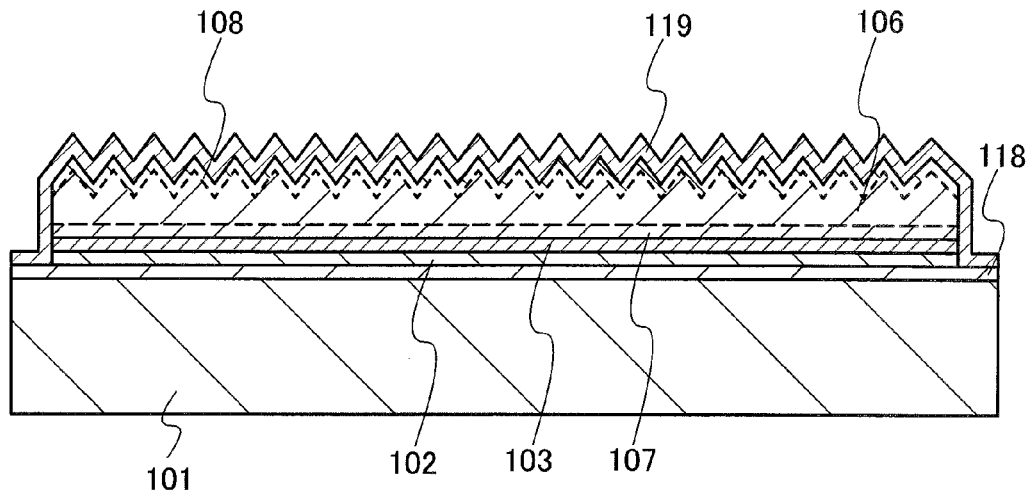

In this embodiment mode, manufacturing steps which are different from those in Embodiment Mode 2 will be described with reference to FIGS. 16A to 16C. The single crystal semiconductor layer 106 is bonded over the supporting substrate 101 (FIG. 6B), and laser treatment for recovering the single crystal semiconductor layer 106 where crystal defects remain and for making the surface rough is performed as shown in FIG. 16A. Then, as shown in FIG. 16B, an impurity element which imparts a conductivity type opposite to that of the first impurity semiconductor layer 107 is added into the single crystal semiconductor layer 106 to form the second impurity semiconductor layer 108. After that, as shown in FIG. 16C, the antireflection film 119 is formed over the second impurity semiconductor layer 108.

Figure 17A:
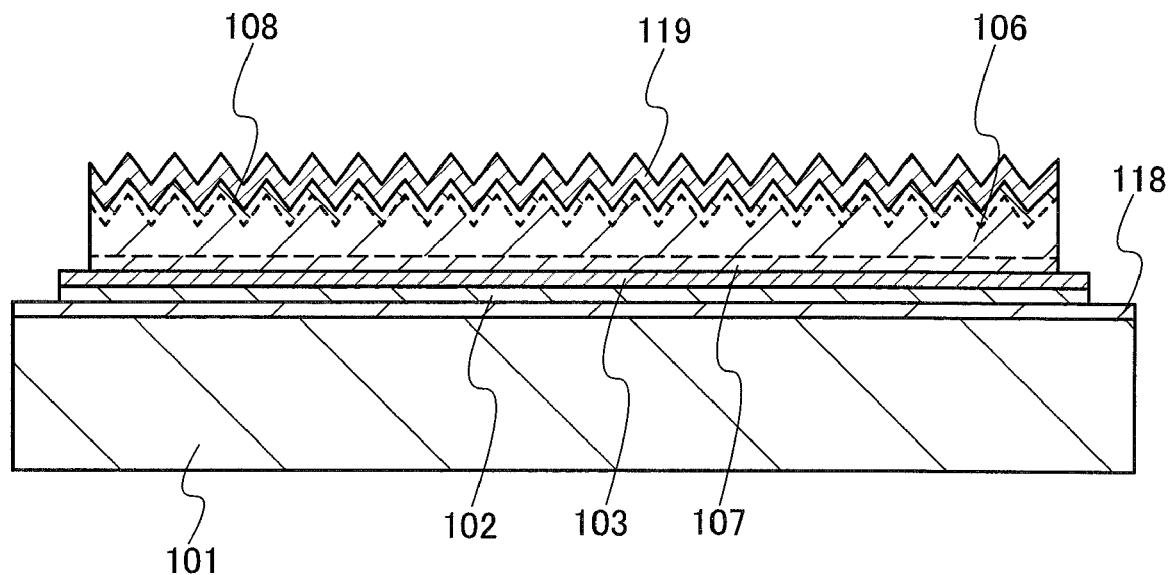
FIGS. 17A and 17B are cross-sectional views for describing the manufacturing process of the photoelectric conversion device.
Figure 17B:
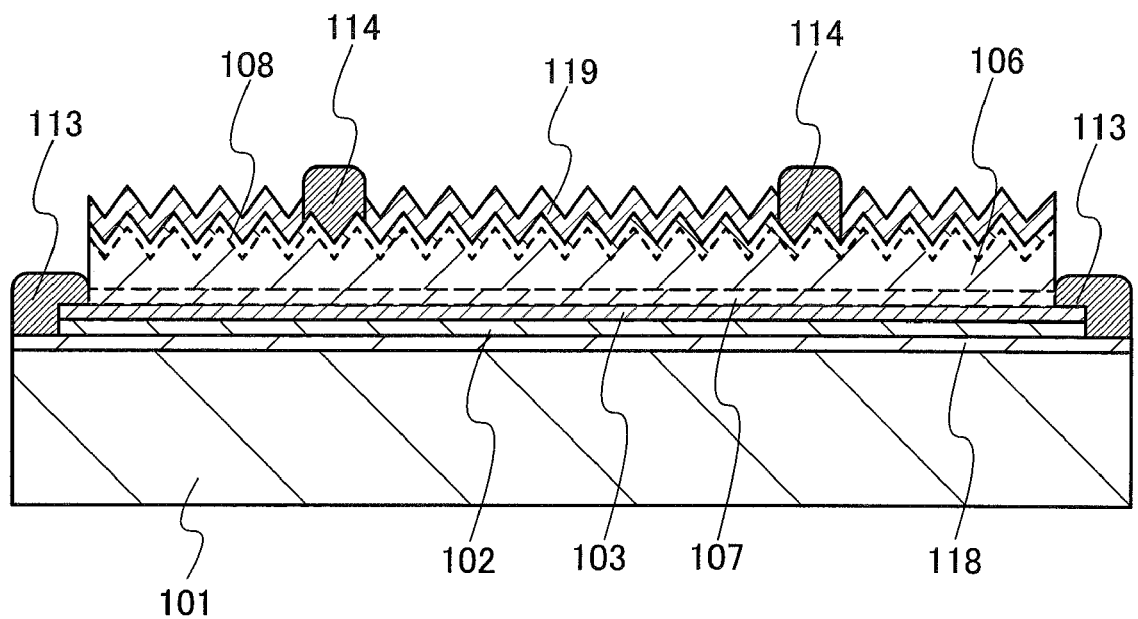

After that, an end portion of the single crystal semiconductor layer 106 is etched to expose part of the first electrode 103 as shown in FIG. 17A, and the first auxiliary electrode 113 and the second auxiliary electrode 114 are formed as shown in FIG. 17B. The second auxiliary electrode 114 is formed over the antireflection film 119, and then, a breakdown voltage is applied instantaneously thereon, thereby the second auxiliary electrode 114 can be electrically connected to the second impurity semiconductor layer 108 and serve as an auxiliary electrode.

In accordance with this embodiment mode, the anti-reflection film 119 which also functions as a passivation film is provided for the single crystal semiconductor layer 106 after the second impurity semiconductor layer 108 is formed, so that the surface recombination rate can be decreased and the conversion efficiency of a photoelectric conversion device can be increased.

This embodiment mode can be combined with any of Embodiment Modes 2 to 7 as appropriate for implementation.

Embodiment Mode 9

Figure 18A:
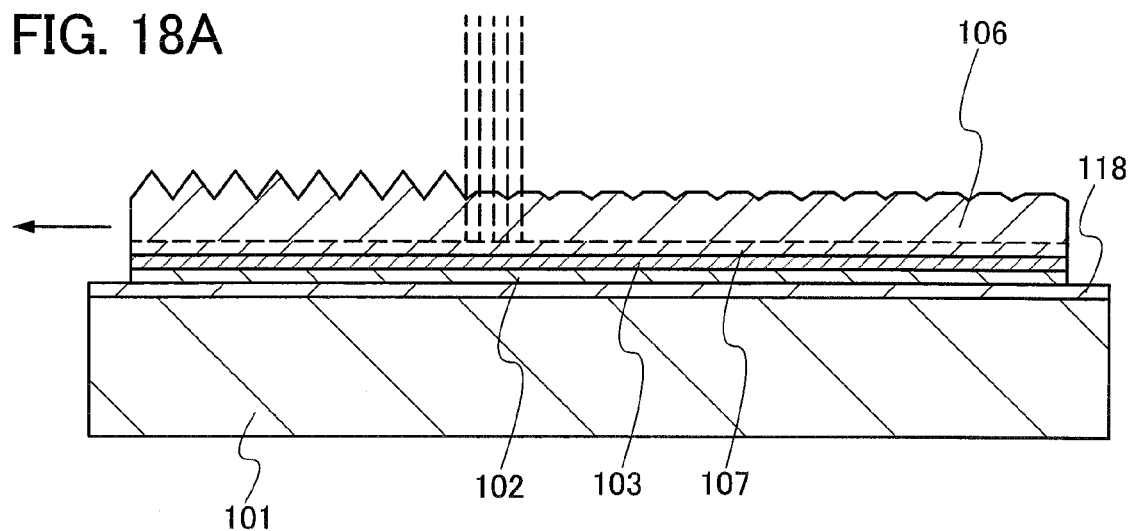
FIGS. 18A to 18C are cross-sectional views for describing a manufacturing process of the photoelectric conversion device.
Figure 18B:
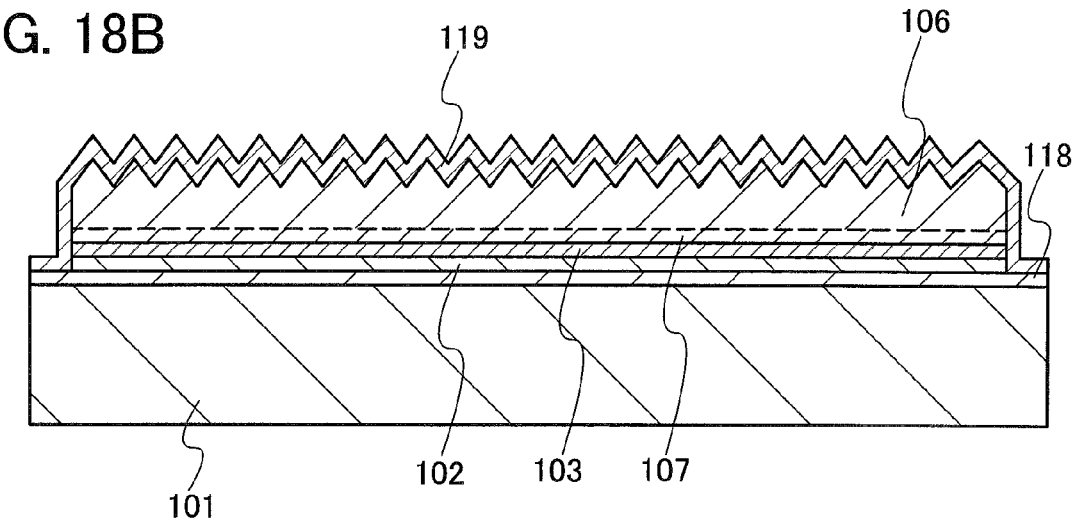
Figure 18C:
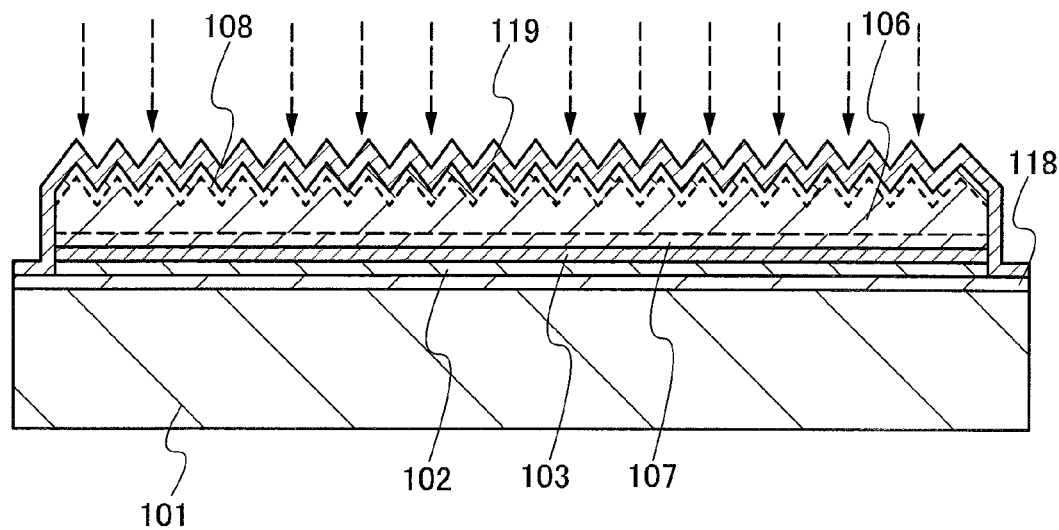

In this embodiment mode, manufacturing steps which are different from those in Embodiment Mode 2 will be described with reference to FIGS. 18A to 18C. The single crystal semiconductor layer 106 is bonded over the supporting substrate 101 (FIG. 6B), and laser treatment for recovering the single crystal semiconductor layer 106 where crystal defects remain and for making the surface rough is performed as shown in FIG. 18A. Then, the antireflection film 119 is formed as shown in FIG. 18B, and the second impurity semiconductor layer 108 is formed as shown in FIG. 18C. According to this embodiment mode, since the laser treatment is performed before the formation of the second impurity semiconductor layer 108, the melting region with laser beam irradiation can be enlarged to inside of the single crystal semiconductor layer 106 so that defect repair effect by recrystallization can be further enhanced.

After that, the peripheral portion of the single crystal semiconductor layer 106 is etched such that part of the first electrode 103 is exposed as shown in FIG. 7C, and the first auxiliary electrode 113 and the second auxiliary electrode 114 may be formed. The second auxiliary electrode 114 which is formed over the anti-reflection film 119 can function as an electrode due to a burn-in contact formed by instantaneously applying a breakdown voltage.

This embodiment mode can be combined with any of Embodiment Modes 2 to 7 as appropriate for implementation.

Embodiment Mode 10

Figure 19A:
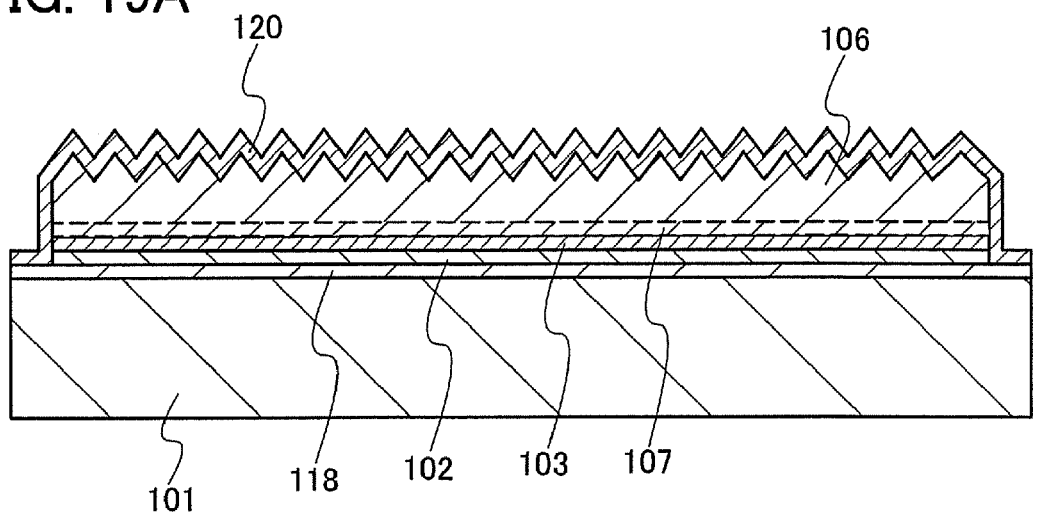
FIGS. 19A to 19C are cross-sectional views for describing a manufacturing process of the photoelectric conversion device.
Figure 19B:
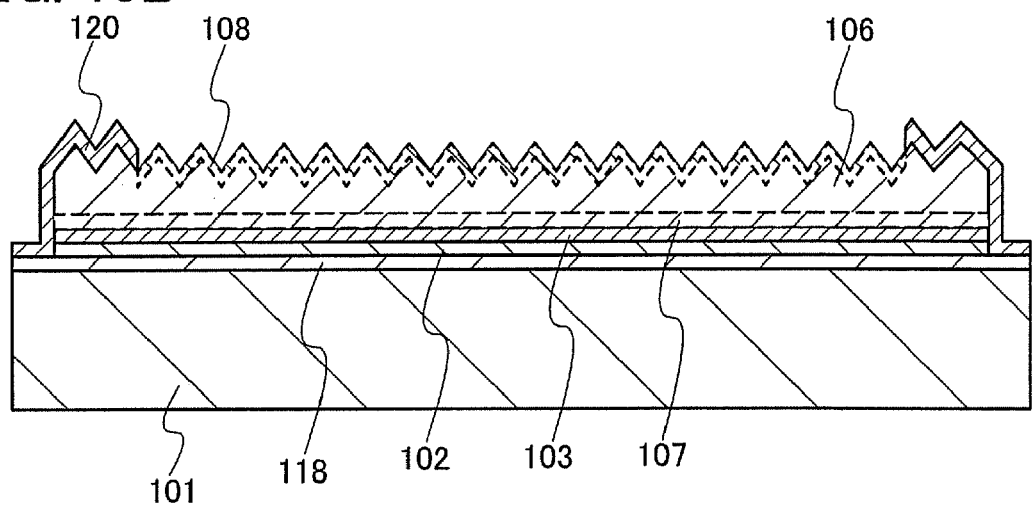
Figure 19C:
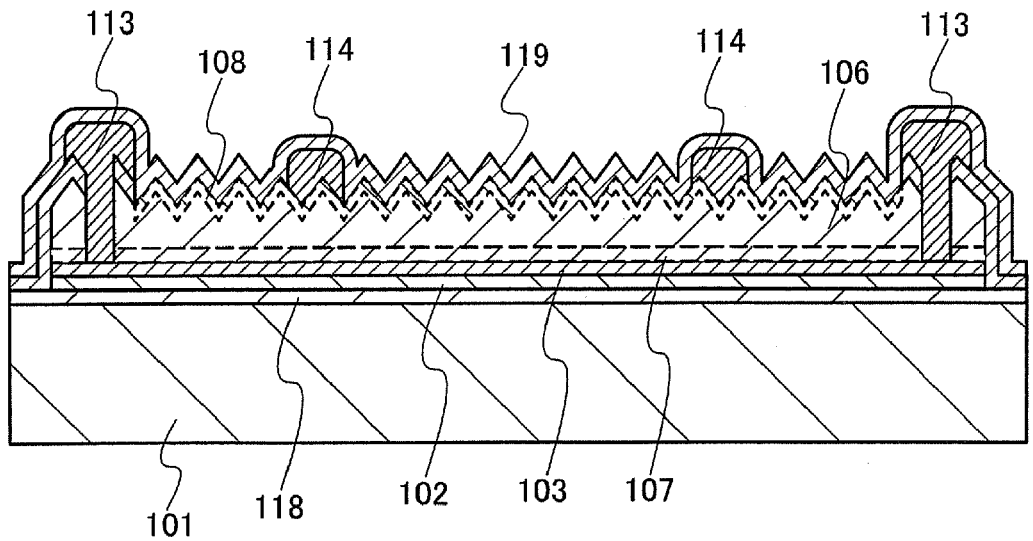

In this embodiment mode, manufacturing steps which are different from those in Embodiment Mode 2 will be described with reference to FIGS. 19A to 19C. Laser treatment is performed on the single crystal semiconductor layer 106 over the supporting substrate 101, so that recrystallization is performed and the surface is made rough. Then, as shown in FIG. 19A, the insulating layer 120 is formed covering the single crystal semiconductor layer 106. Then, as shown in FIG. 19B, an opening portion is formed in the insulating layer 120 to expose part of the single crystal semiconductor layer 106, and the second auxiliary electrode 114 is formed in the opening portion. Then, as shown in FIG. 19C, an opening portion is formed to reach the first electrode 103 through the insulating layer 120 and the single crystal semiconductor layer 106, and the first auxiliary electrode 113 and the second auxiliary electrode 114 are formed. Further, the antireflection film 119 is formed. According to this embodiment mode, the opening portion is formed in the single crystal semiconductor layer 106 and the first auxiliary electrode 113 is formed to electrically connect to the first electrode 103, thereby reduction in size of the photoelectric conversion device can be achieved.

This embodiment mode can be combined with any of Embodiment Modes 2 to 7 as appropriate for implementation.

Embodiment Mode 11

Figure 20A:
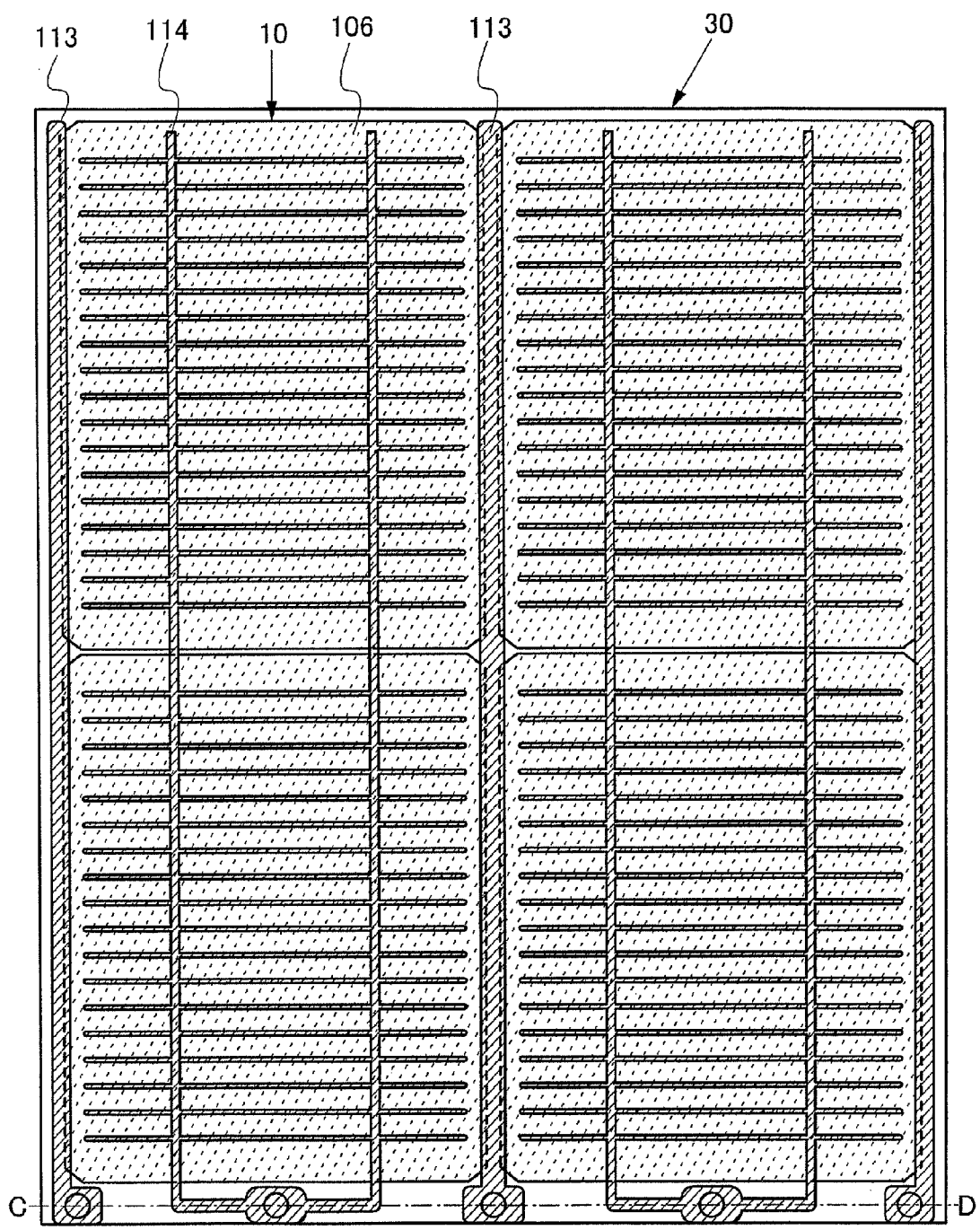
FIG. 20A is a plan view for describing a structure of a solar photovoltaic module.

An example of a solar photovoltaic module using any photoelectric conversion device manufactured according to Embodiment Modes 1 to 10 is shown in FIG. 20A. A solar photovoltaic module 30 includes the photoelectric conversion device 10 using the single crystal semiconductor layer 106 provided for the supporting substrate 101. In the single crystal semiconductor layer 106, a first impurity semiconductor layer, a second impurity semiconductor layer, and/or the like are/is formed to produce a photoelectric conversion function.

Figure 20B:
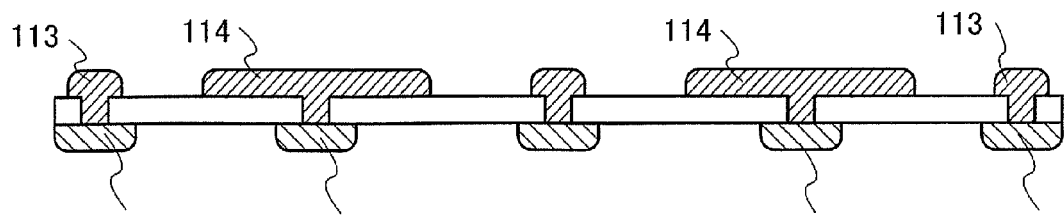
FIG. 20B is a cross-sectional view taken along section line C-D of FIG. 20A.

The first auxiliary electrode 113 is connected to a first electrode which is formed on a rear-surface side of the single crystal semiconductor layer 106, and the second auxiliary electrode 114 is a comb-shaped or lattice-shaped electrode. The first auxiliary electrode 113 and the second auxiliary electrode 114 are formed over one surface of the supporting substrate 101, and connected to a first rear electrode 121 and a second rear electrode 122 for connection, respectively at end regions of the supporting substrate 101. FIG. 20B is a cross-sectional view taken along section line C-D of FIG. 20A. The first auxiliary electrode 113 is connected to the first rear electrode 121 and the second auxiliary electrode 114 is connected to the second rear electrode 122 through pass-through openings of the supporting substrate 101.

The photoelectric conversion device 10 is manufactured by bonding the single crystal semiconductor layer 106 to the supporting substrate 101 as described above, whereby reduction in thickness of the solar photovoltaic module can be achieved. Note that in this embodiment mode, the tandem photoelectric conversion device 20 shown in FIG. 3 can be applied instead of the photoelectric conversion device 10.

Embodiment Mode 12

Figure 21:
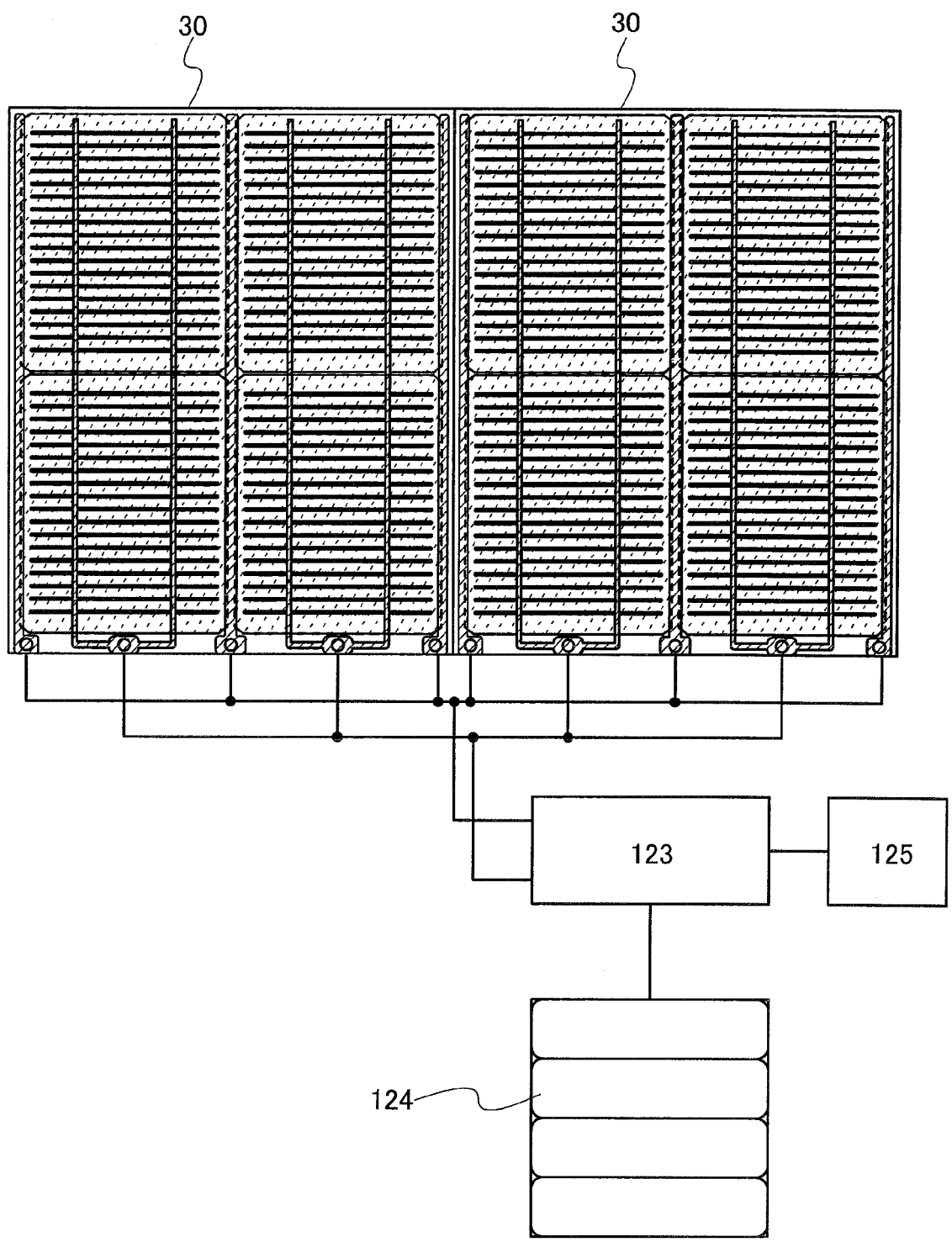
FIG. 21 is a view for describing an example of a solar photovoltaic system.

FIG. 21 shows an example of a solar photovoltaic system using the solar photovoltaic module 30. Output power of one or a plurality of solar photovoltaic modules 30 charges a rechargeable battery 124 with a charge control circuit 123. In the case where the charged amount of the rechargeable battery 124 is large, the output power is directly outputted to a load 125 in some cases.

When an electric double layer capacitor is used for the rechargeable battery 124, a chemical reaction is not needed for charging so that the battery can be charged rapidly, and the lifetime of the rechargeable battery 124 can be increased by about 8 times and the charge-discharge efficiency thereof can be increased by 1.5 times in comparison with a lead battery or the like which uses a chemical reaction. The load 125 can be used for various purposes such as lighting such as a fluorescent lamp, a light-emitting diode, or an electroluminescent panel, and a small-size electronic device.

This application is based on Japanese Patent Application serial No. 2007-309770 filed with Japan Patent Office on Nov. 30, 2007, the entire contents of which are hereby incorporated by reference.

What is claimed is:

1. A method for manufacturing a photoelectric conversion device comprising:
    forming a first semiconductor layer over a single crystal semiconductor substrate, the first semiconductor layer containing a first impurity which imparts one conductivity type;
    forming a damaged layer in the single crystal semiconductor substrate by introducing an ion beam through one surface of the single crystal semiconductor substrate;
    attaching the single crystal semiconductor substrate to a supporting substrate having an insulating surface with a bonding layer interposed therebetween;
    performing heat treatment on the single crystal semiconductor substrate to cleave the damaged layer and separate a single crystal semiconductor layer from the single crystal semiconductor substrate;
    irradiating a cleavage plane of the single crystal semiconductor layer with a pulsed laser beam in an atmosphere containing an inert gas and oxygen to provide roughness for a surface of the single crystal semiconductor layer;
    forming a second semiconductor layer containing a second impurity having an opposite conductivity type to the one conductivity type on a cleavage plane side of the single crystal semiconductor layer; and
    forming a reflecting film over the second semiconductor layer, after forming the second semiconductor layer.

2. The method for manufacturing a photoelectric conversion device according to claim 1, the first semiconductor layer has n-type conductivity, and the second semiconductor layer has p-type conductivity.

3. The method for manufacturing a photoelectric conversion device according to claim 1, the first semiconductor layer has p-type conductivity, and the second semiconductor layer has n-type conductivity.

4. The method for manufacturing a photoelectric conversion device according to claim 1, wherein an oxygen concentration in the atmosphere containing the inert gas and oxygen is 0.1 to 25 volume percent.

5. The method for manufacturing a photoelectric conversion device according to claim 1, wherein the single crystal semiconductor layer in an irradiated region is heated at a temperature of 250 to 600° C. when the single crystal semiconductor layer is irradiated with the pulsed laser beam.

6. A method for manufacturing a photoelectric conversion device comprising:

forming a first semiconductor layer over a single crystal semiconductor substrate, the first semiconductor layer containing a first impurity which imparts one conductivity type;

forming a damaged layer in the single crystal semiconductor substrate by introducing an ion beam through one surface of the single crystal semiconductor substrate;

attaching the single crystal semiconductor substrate to a supporting substrate having an insulating surface with a bonding layer interposed therebetween;

performing heat treatment on the single crystal semiconductor substrate to cleave the damaged layer and separate a single crystal semiconductor layer from the single crystal semiconductor substrate;

irradiating a cleavage plane of the single crystal semiconductor layer with a pulsed laser beam in an atmosphere containing an inert gas and oxygen to provide roughness for a surface of the single crystal semiconductor layer;

forming a reflecting film over the single crystal semiconductor layer; and forming a second semiconductor layer containing a second impurity having an opposite conductivity type to the one conductivity type on a cleavage plane side of the single crystal semiconductor layer, after forming the reflecting film.

7. The method for manufacturing a photoelectric conversion device according to claim 6, the first semiconductor layer has n-type conductivity, and the second semiconductor layer has p-type conductivity.

8. The method for manufacturing a photoelectric conversion device according to claim 6, the first semiconductor layer has p-type conductivity, and the second semiconductor layer has n-type conductivity.

9. The method for manufacturing a photoelectric conversion device according to claim 6, wherein an oxygen concentration in the atmosphere containing the inert gas and oxygen is 0.1 to 25 volume percent.

10. The method for manufacturing a photoelectric conversion device according to claim 1, wherein the single crystal semiconductor layer in an irradiated region is heated at a temperature of 250 to 600° C. when the single crystal semiconductor layer is irradiated with the pulsed laser beam.

11. A method for manufacturing a photoelectric conversion device comprising:

forming a first semiconductor layer over a single crystal semiconductor substrate, the first semiconductor layer containing a first impurity which imparts one conductivity type;

forming a damaged layer in the single crystal semiconductor substrate by introducing an ion beam through one surface of the single crystal semiconductor substrate;

attaching the single crystal semiconductor substrate to a supporting substrate having an insulating surface with a bonding layer interposed therebetween;

performing heat treatment on the single crystal semiconductor substrate to cleave the damaged layer and separate a single crystal semiconductor layer from the single crystal semiconductor substrate;

irradiating a cleavage plane of the single crystal semiconductor layer with a pulsed laser beam in an atmosphere containing an inert gas and oxygen to provide roughness for a surface of the single crystal semiconductor layer;

forming a second semiconductor layer containing a second impurity having an opposite conductivity type to the one conductivity type on a cleavage plane side of the single crystal semiconductor layer;

forming an electrode in the single crystal semiconductor layer electrically connected to the first semiconductor layer; and forming a reflecting film over the second semiconductor layer and the electrode.

12. The method for manufacturing a photoelectric conversion device according to claim 11, the first semiconductor layer has n-type conductivity, and the second semiconductor layer has p-type conductivity.

13. The method for manufacturing a photoelectric conversion device according to claim 11, the first semiconductor layer has p-type conductivity, and the second semiconductor layer has n-type conductivity.

14. The method for manufacturing a photoelectric conversion device according to claim 11, wherein an oxygen concentration in the atmosphere containing the inert gas and oxygen is 0.1 to 25 volume percent.

15. The method for manufacturing a photoelectric conversion device according to claim 11, wherein the single crystal semiconductor layer in an irradiated region is heated at a temperature of 250 to 600° C. when the single crystal semiconductor layer is irradiated with the pulsed laser beam.

* * * * *